US010381524B2

(12) United States Patent
Matsumura

(10) Patent No.: US 10,381,524 B2
(45) Date of Patent: Aug. 13, 2019

(54) SEMICONDUCTOR LIGHT EMITTING ELEMENT INCLUDING PROTECTIVE FILM AND LIGHT SHIELDING MEMBER

(71) Applicant: NICHIA CORPORATION, Anan-shi, Tokushima (JP)

(72) Inventor: Hiroaki Matsumura, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 13/851,727

(22) Filed: Mar. 27, 2013

(65) Prior Publication Data

US 2013/0277700 A1    Oct. 24, 2013

(30) Foreign Application Priority Data

Apr. 18, 2012  (JP) .................................. 2012-094699
Mar. 15, 2013  (JP) .................................. 2013-052938

(51) Int. Cl.
  *H01L 33/38*  (2010.01)
  *H01L 33/46*  (2010.01)
  *H01L 33/50*  (2010.01)

(52) U.S. Cl.
  CPC .............. *H01L 33/50* (2013.01); *H01L 33/46* (2013.01); *H01L 33/382* (2013.01); *H01L 2924/0002* (2013.01)

(58) Field of Classification Search
  USPC ......................................................... 257/98
  See application file for complete search history.

(56) References Cited

U.S. PATENT DOCUMENTS

| 8,269,226 | B2* | 9/2012 | Moon | H01L 33/44 |
| | | | | 257/81 |
| 8,497,146 | B2* | 7/2013 | Odnoblyudov et al. | 438/33 |
| 8,866,173 | B2* | 10/2014 | Jeong | H01L 33/405 |
| | | | | 257/13 |
| 9,082,931 | B2* | 7/2015 | Katsuno | H01L 33/62 |

(Continued)

FOREIGN PATENT DOCUMENTS

JP    H06-318731 A    11/1994
JP    2002-280601     9/2002

(Continued)

*Primary Examiner* — Lex H Malsawma
*Assistant Examiner* — Eric W Jones
(74) *Attorney, Agent, or Firm* — Foley & Lardner LLP

(57) ABSTRACT

To provide a semiconductor light emitting element of which color irregularity is improved, the semiconductor light emitting element according to the present invention comprises: a support substrate; a semiconductor laminated structural body provided on the support substrate, the semiconductor laminated structural body having a first semiconductor layer, a luminescent layer, and a second semiconductor layer; a first electrode electrically connected to the first semiconductor layer; a second electrode electrically connected to the second semiconductor layer; a light shielding member covering a portion of an upper surface and side surfaces of the semiconductor laminated structural body, the light shielding member electrically separated from both of the first electrode and the second electrode; and a wavelength conversion member covering an upper surface not covered by the light shielding member of the semiconductor laminated structural body.

26 Claims, 16 Drawing Sheets

(56) References Cited

U.S. PATENT DOCUMENTS

| | | | |
|---|---|---|---|
| 9,705,039 B2* | 7/2017 | Obata | H01L 33/38 |
| 2002/0134986 A1 | 9/2002 | Kamemura et al. | |
| 2004/0245530 A1 | 12/2004 | Kameyama et al. | |
| 2006/0055309 A1* | 3/2006 | Ono | H01L 25/0753 313/492 |
| 2006/0124954 A1* | 6/2006 | Akaishi | H01L 33/38 257/99 |
| 2006/0261364 A1* | 11/2006 | Suehiro | H01L 33/56 257/100 |
| 2007/0034995 A1 | 2/2007 | Kameyama et al. | |
| 2008/0308832 A1* | 12/2008 | Hsieh | H01L 33/44 257/98 |
| 2010/0065861 A1 | 3/2010 | Nagai | |
| 2010/0084675 A1 | 4/2010 | Ueno et al. | |
| 2010/0171135 A1 | 7/2010 | Engl et al. | |
| 2011/0062488 A1 | 3/2011 | Uemura et al. | |
| 2011/0079805 A1* | 4/2011 | Yu et al. | 257/98 |
| 2011/0186892 A1* | 8/2011 | Jeong | H01L 33/0079 257/98 |
| 2011/0220924 A1* | 9/2011 | Fukuda | 257/91 |
| 2011/0241033 A1 | 10/2011 | Nagai | |
| 2011/0254040 A1 | 10/2011 | Nagai | |
| 2011/0260192 A1* | 10/2011 | Kwak et al. | 257/98 |
| 2012/0007121 A1* | 1/2012 | Lee | H01L 33/382 257/98 |
| 2012/0032218 A1* | 2/2012 | Choi | H01L 33/08 257/98 |
| 2012/0098016 A1* | 4/2012 | Hoppel et al. | 257/98 |
| 2012/0261697 A1* | 10/2012 | Margalit et al. | 257/98 |
| 2013/0221392 A1 | 8/2013 | Engl et al. | |
| 2013/0228815 A1* | 9/2013 | Odnoblyudov et al. | 257/98 |
| 2014/0061702 A1* | 3/2014 | Yamamoto et al. | 257/98 |

FOREIGN PATENT DOCUMENTS

| | | |
|---|---|---|
| JP | 2004-363380 A | 12/2004 |
| JP | 2010-508669 A | 3/2010 |
| JP | 2010-092897 | 4/2010 |
| JP | 2010-525585 A | 7/2010 |
| JP | 2011-040425 | 2/2011 |
| JP | 2011-066048 | 3/2011 |

* cited by examiner

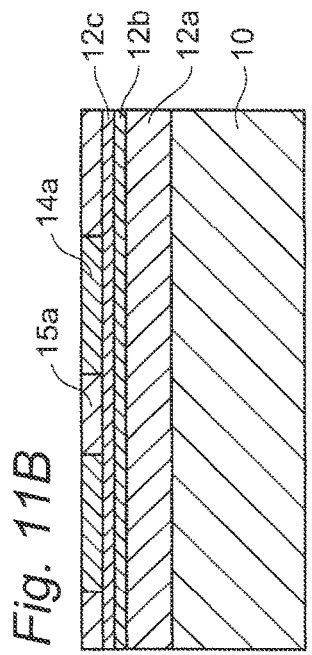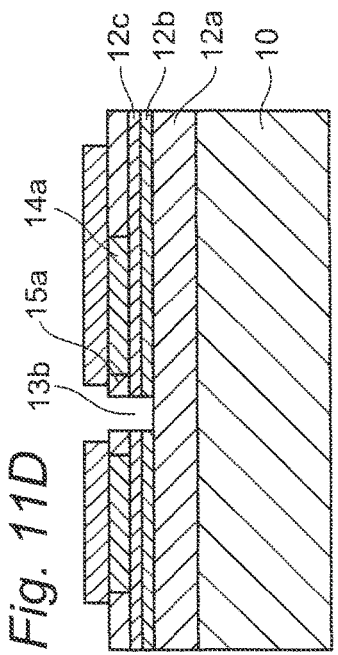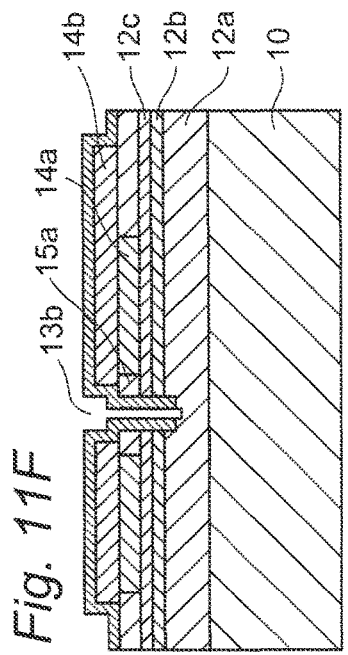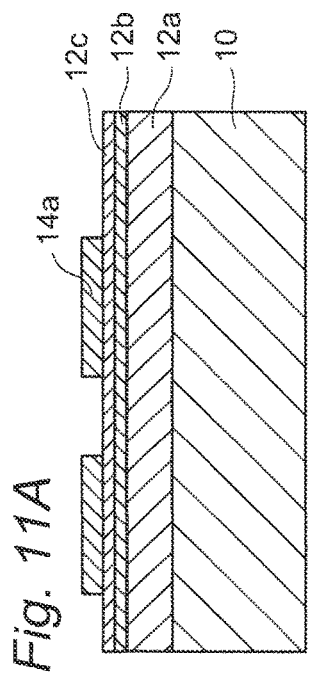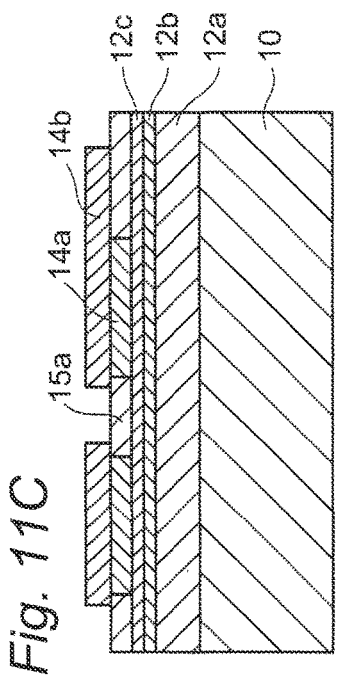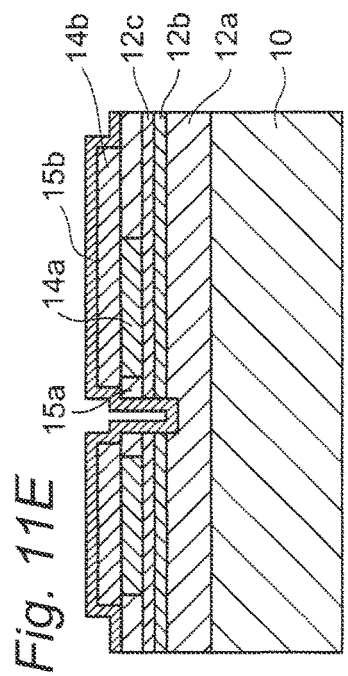

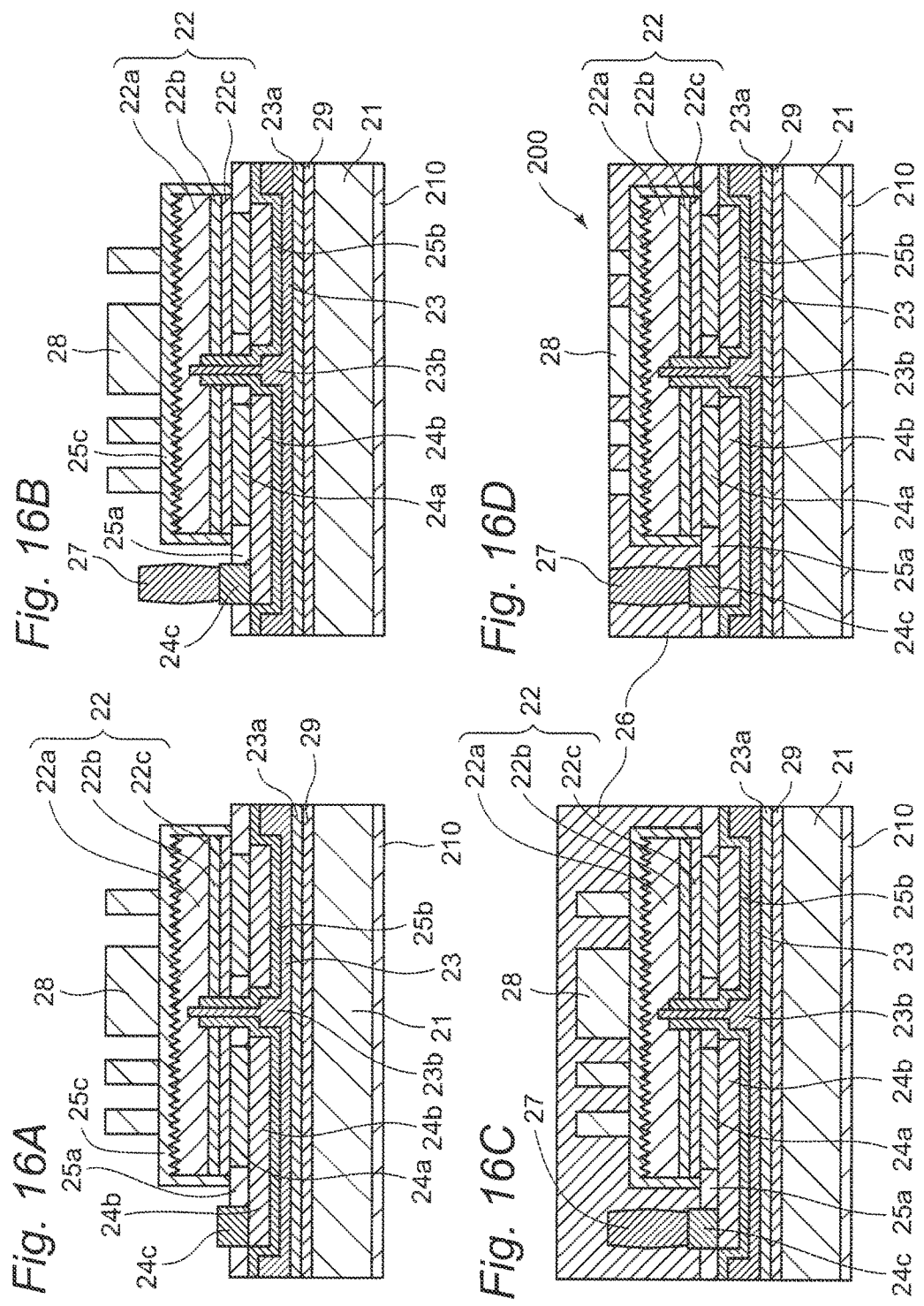

SEMICONDUCTOR LIGHT EMITTING ELEMENT INCLUDING PROTECTIVE FILM AND LIGHT SHIELDING MEMBER

BACKGROUND OF THE INVENTION

Technical Field

The present invention relates to a semiconductor light emitting element.

Background of Invention

A semiconductor light emitting device capable of emitting an appropriate luminescent color by applying a wavelength conversion member onto a surface of the semiconductor light emitting element has been developed.

For example, Patent Literature 1 discloses a semiconductor light emitting device provided with a dome-shaped phosphor-containing layer formed on an upper surface of a semiconductor device by dropping a wavelength conversion member onto the upper surface of the semiconductor device. The semiconductor light emitting device includes at least one corner portion on a light-emitting face of the semiconductor layer. In order to prevent color irregularity from being generated due to ununiformity of a film thickness of the wavelength conversion member, a film thickness of the phosphor-containing layer becomes thinner from a center portion of the semiconductor layer to an outer edge thereof and provided with a non-radiative portion of which at least one corner portion is irradiated with light.

In other words, the light emitting device of the Patent Literature 1 is directed to, in consideration with such a problem that a wavelength conversion member would not sufficiently spread to each corner portion of the semiconductor light emitting element to wet therearound when applying the wavelength conversion member by means of a dispenser, the semiconductor light emitting device provided with the non-radiative portion formed thereon so as not to irradiate light to the corner portion, thereby preventing the color irregularity from being generated.

[Patent Literature 1]

JP 2010-92897 A

However, since the semiconductor light emitting device disclosed in Patent Literature 1 is only provided with a light impeding portion and a non-radiative portion at a corner portion of the semiconductor layer, so that a wavelength of the light emitted from a luminescent layer, the luminescent layer exposing to a side surface of the semiconductor layer, would not be converted, resulting in generation of the color irregularity. A distance passing through the wavelength conversion member differs between the light emitted from the side surface of the luminescent layer and the light emitted from the upper surface of the semiconductor layer, so that the color irregularity is generated.

SUMMARY OF INVENTION

The present invention has been made so as to solve the above problem. An object of the present invention is to provide a semiconductor light emitting element of which color irregularity is improved.

According to the present invention, the problem is solved by the following means.

A semiconductor light emitting element according to the present invention comprises:

a support substrate;

a semiconductor laminated structural body provided on the support substrate, the semiconductor laminated structural body having a first semiconductor layer, a luminescent layer, and a second semiconductor layer;

a first electrode electrically connected to the first semiconductor layer;

a second electrode electrically connected to the second semiconductor layer;

a light shielding member covering a portion of an upper surface and side surfaces of the semiconductor laminated structural body, the light shielding member electrically separated from both of the first electrode and the second electrode; and a wavelength conversion member covering an upper surface not covered by the light shielding member of the semiconductor laminated structural body.

BRIEF DESCRIPTION OF DRAWINGS

FIG. 11 is a schematic view illustrating a process of a method for manufacturing the semiconductor light emitting element according to the first embodiment, FIG. 11A showing a reflecting electrode having been patterned into a predetermined shape on the surface of a second semiconductor layer, FIG. 11B showing an insulating film formed on the second semiconductor layer, FIG. 11C showing a wiring electrode formed substantially throughout the entire surface of the reflecting electrode and the insulating film, FIG. 11D showing the first semiconductor layer etched to form a through hole, FIG. 11E showing an insulating film formed on the wiring electrode, the insulating film the reflecting electrode, the second semiconductor layer, the luminescent layer, and the first semiconductor layer, which, in combination forms a wall surface of the through-hole, and FIG. 11F showing the insulating film removed by etching such that the first semiconductor layer is exposed.

FIG. 16 is a schematic view illustrating a process of a method for manufacturing the semiconductor light emitting element according to a second embodiment, FIG. 16A showing a wavelength conversion member having shape enclosing a character N in a circle provided on the upper surface of the semiconductor laminated structural body, FIG. 16B showing a bump higher than the semiconductor laminated structural body formed on the pad electrode, FIG. 16C showing exposed surfaces of the pad electrode, the insulating layer, the bump, the wavelength conversion member, and the protective film exposed from the wavelength conversion member covered by a light shielding member, and FIG. 16D showing the resin cut such that the upper surface of the bump is exposed to have the same height as the upper surface of the light shielding member and the upper surface of the wavelength conversion member.

DETAILED DESCRIPTION OF INVENTION

Figure 1:
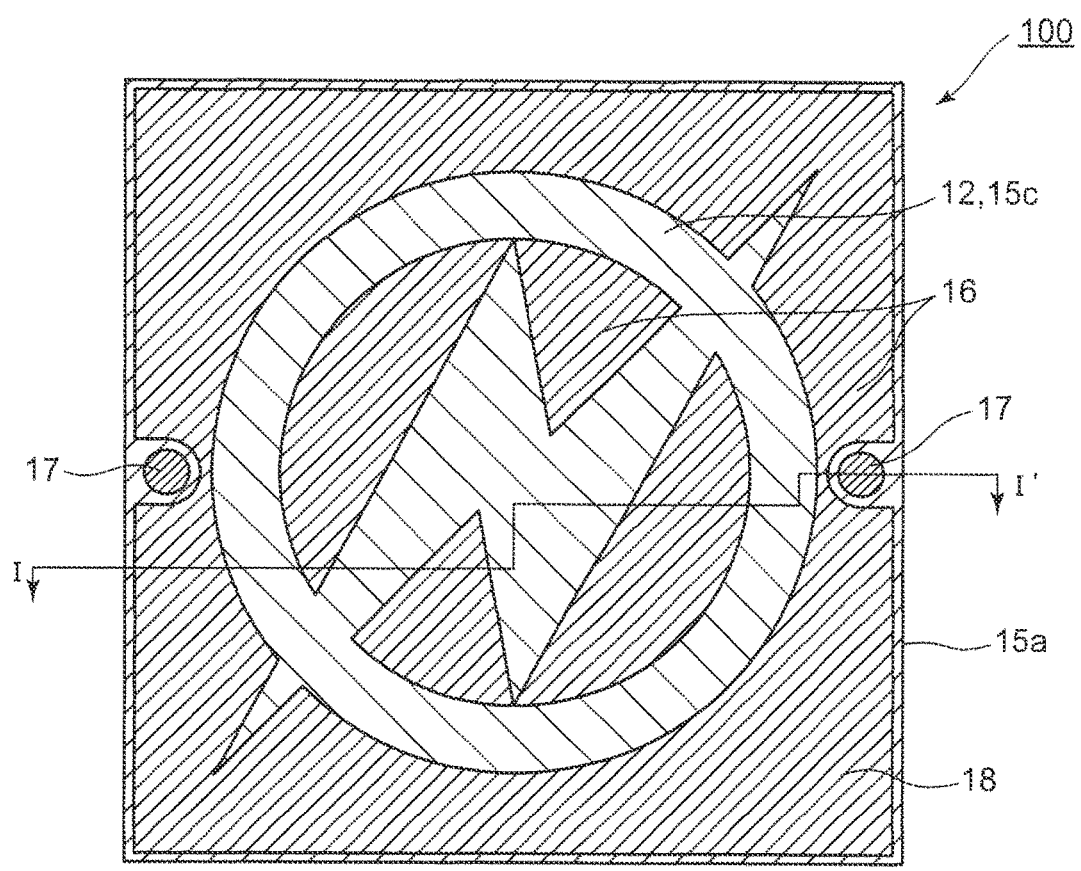
FIG. 1 is a schematic plane view illustrating a semiconductor light emitting element according to a first embodiment.

A semiconductor light emitting element according to the present invention is described below.

The semiconductor light emitting element comprises:
a support substrate;
a semiconductor laminated structural body provided on the support substrate, the semiconductor laminated structural body having a first semiconductor layer, a luminescent layer, and a second semiconductor layer;
a first electrode electrically connected to the first semiconductor layer;
a second electrode electrically connected to the second semiconductor layer;
a light shielding member covering a portion of an upper surface and side surfaces of the semiconductor laminated structural body, the light shielding member electrically separated from both of the first electrode and the second electrode; and
a wavelength conversion member covering an upper surface not covered by the light shielding member of the semiconductor laminated structural body.

Accordingly, since the side surfaces of the semiconductor laminated structural body is covered with the light shielding member, the light can be prevented from being leaked from the side surfaces. Therefore, the light from the luminescent layer is emitted from the upper surface of the semiconductor laminated structural body and thus a distance that the light passes through the wavelength conversion member becomes almost uniform. As a result thereof, the color irregularity can be improved.

According to the present invention, a semiconductor light emitting element of which color irregularity is improved can be provided.

In the upper surface of the semiconductor laminated structural body, preferably, the wavelength conversion member further covers at least a portion of the light shielding member. With such a configuration, an adhesion property of the light shielding member to the semiconductor laminated structural body improves. Most of the light from the luminescent layer is emitted through the wavelength conversion member covering the upper surface of the semiconductor laminated structural body not covered by the light shielding member. However, with the configuration of the present invention, a portion of the light emitted from the upper surface of the semiconductor laminated structural body which is not covered by the light shielding member passes through the wavelength conversion member covering the light shielding member, so that an outline of a shape of an opening of the light shielding member can be blurred.

Preferably, the side surfaces of the semiconductor laminated structural body are inclined. Accordingly, when the side surfaces are normally tapered, the light shielding member can be formed with ease in comparison with a case where the side surfaces of the semiconductor laminated structural body are formed into a perpendicularly tapered shape or an inversely tapered shape. When the side surfaces are inversely tapered, the light can be reflected against the side surfaces to extract and guide the light upwardly within the semiconductor laminated structural body.

Preferably, the light shielding member covering a portion of the upper surface of the semiconductor laminated structural body and the light shielding member covering the side surfaces thereof are made of the same material. If so, a degree of light shielding of the light shielding member covering the portion of the upper surface and the side surfaces of the semiconductor laminated structural body becomes uniform, so that a good light emission contrast can be obtained.

The semiconductor laminated structural body includes a first semiconductor layer, a luminescent layer, and a second semiconductor layer, and is provided with a first electrode electrically connected to the first semiconductor layer and a second electrode electrically connected to the second semiconductor layer. Preferably, the first electrode and the second electrode are provided between the support substrate and the semiconductor laminated structural body. With such a configuration, current can be uniformly flown through the luminescent layer between the first semiconductor layer and the second semiconductor layer. More specifically, without inhibiting current uniformity, the light shielding member can be set to any appropriate shape (i.e., a degree of freedom of the shape of the shielding member can be improved). In the conventional bonded type light emitting device provided with a first electrode of an n-side on an upper surface of the semiconductor laminated structural body and a second electrode of a p-side on a lower surface of the semiconductor laminated structural body (i.e., the semiconductor laminated structural body is disposed between both electrodes), n-electrode works also as a light shielding member and thus the shape of the light shielding member needs to be determined in consideration with both of performance of the element such as a current diffusion and light shielding property, i.e., there is a limit in arrangement and shape. To the contrary, if both of the first electrode and the second electrode are provided between the support substrate and the semiconductor laminated structural body, the shape of the light shielding member can be set only in consideration with the light shielding property and thus the first electrode and the second electrode can be designed into an optimum shape in consideration with the current uniformity for causing current to flow through the luminescent layer uniformly. According to a preferred electrode structure of the present invention, the light shielding member is provided to the semiconductor laminated structural body independently from the electrodes, so that the current uniformity of the semiconductor light emitting element is not inhibited. As a result thereof, the degree of freedom in designing the light shielding member increases.

The first electrode and the second electrode can be formed, for example, so as to overlap with an insulating layer disposed therebetween (i.e., the first electrode and the second electrode may be laminated in planar view). With such a configuration, the first electrode and the second electrode are layered in planar view so as to form a three dimensional wiring, thereby being able to expand a ratio of the light-emitting area with respect to the entire semiconductor light emitting element.

In other words, if the area occupied by the first electrode or the second electrode becomes larger in a portion other than the area of the semiconductor laminated structural body is provided, the ratio of the area occupied by the semiconductor laminated structural body becomes relatively smaller with respect to the entire semiconductor light emitting element. However, since the first electrode and the second electrode are laminated to each other in planar view to form a spatial wiring, the ratio of the area occupied by the semiconductor laminated structural body can be made relatively larger, thereby being able to enlarge the light-emitting area.

The second electrode comprises a pad electrode which is, preferably, provided in an area different from the semiconductor laminated structural body in planar view. For example, it is preferable that the second electrode extends outward from the underside of the semiconductor laminated structural body and a pad electrode is provided on a portion of the second electrode extending outward. Like this, when the semiconductor laminated structural body and the pad electrode are positioned side by side on the support substrate, it is not required to provide a pad electrode forming surface on the upper surface of the semiconductor laminated structural body, so that the degree of freedom of the shape of the light shielding member increases.

Preferably, the semiconductor light emitting element has a rectangular shape and the pad electrode is positioned in an area other than a corner portion of the semiconductor light emitting element. With such a configuration, there is a sufficient area around the pad electrode and thus, in wire bonding for establishing a connection with an external power source, the semiconductor light emitting element can be prevented from being broken due to a pressure of the wire bonding.

Preferably, the light shielding member contains a metal. Also, preferably, the light shielding member is made of a resin containing a reflective material. Accordingly, the light oriented from the wavelength conversion member to the semiconductor laminated structural body can be reflected efficiently. As a result thereof, the light extraction efficiency improves.

Embodiments of the present invention are described below in detail with reference to drawings. However, the below described embodiments are mere examples of the semiconductor light emitting element for embodying a technical idea of the present invention and thus the present invention is not limited to the below descriptions. Specifically, a size, a material, and a shape of components and a relative positioning thereof in Examples are, unless otherwise noted, not directed to limit the scope of the present invention thereto but mere examples for the sake of the description. Portions provided with the same numbers and/or symbols provided in a plurality of drawings are the same portions or members. Further, for the sake of easy understanding of the present invention, embodiments are described one by one. However, the embodiments are not independent from each other but portions capable of being shared therebetween can be applied with descriptions of the other embodiment.

First Embodiment

Figure 2:
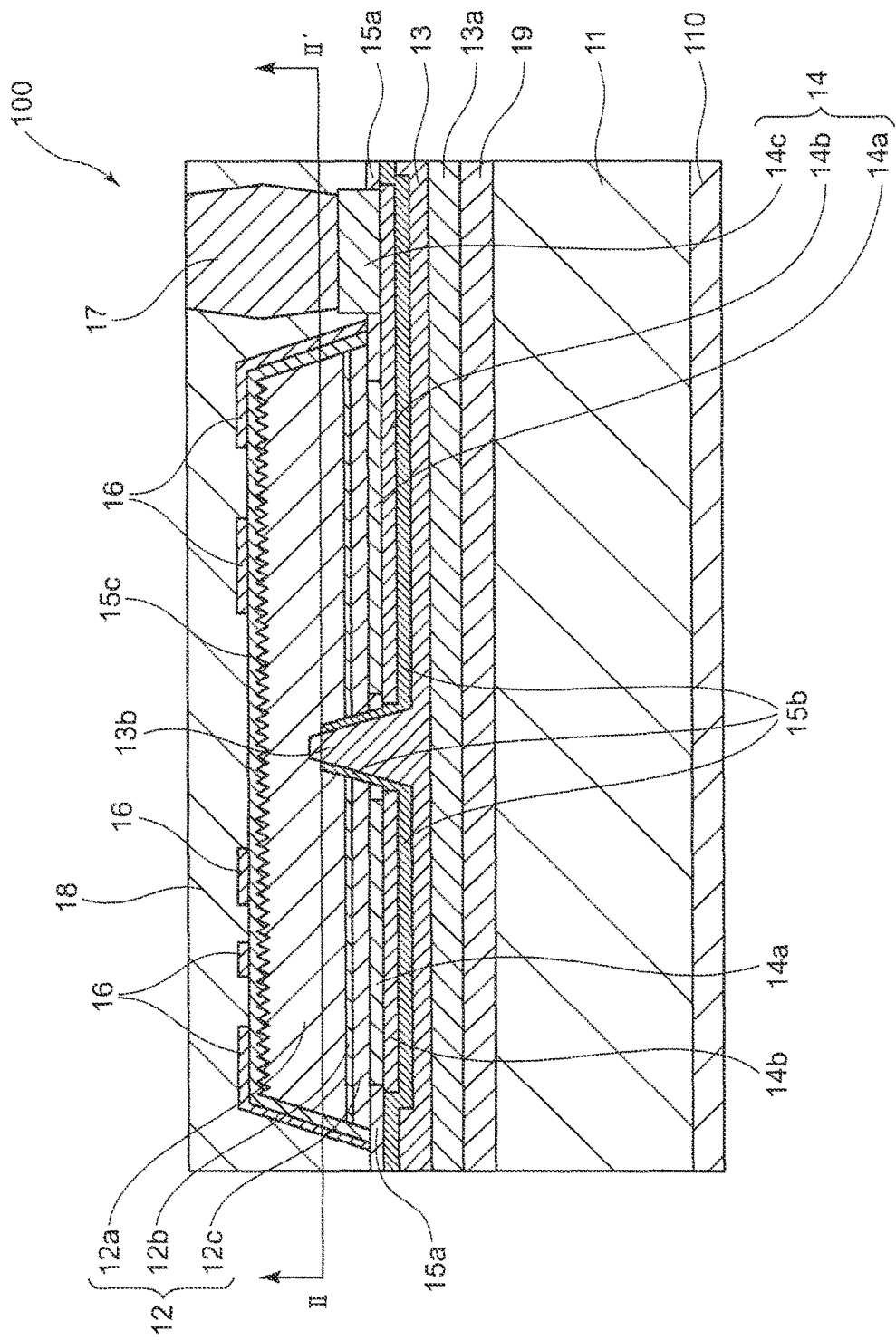
FIG. 2 is a schematic cross sectional view illustrating the semiconductor light emitting element according to the first embodiment.
Figure 3:
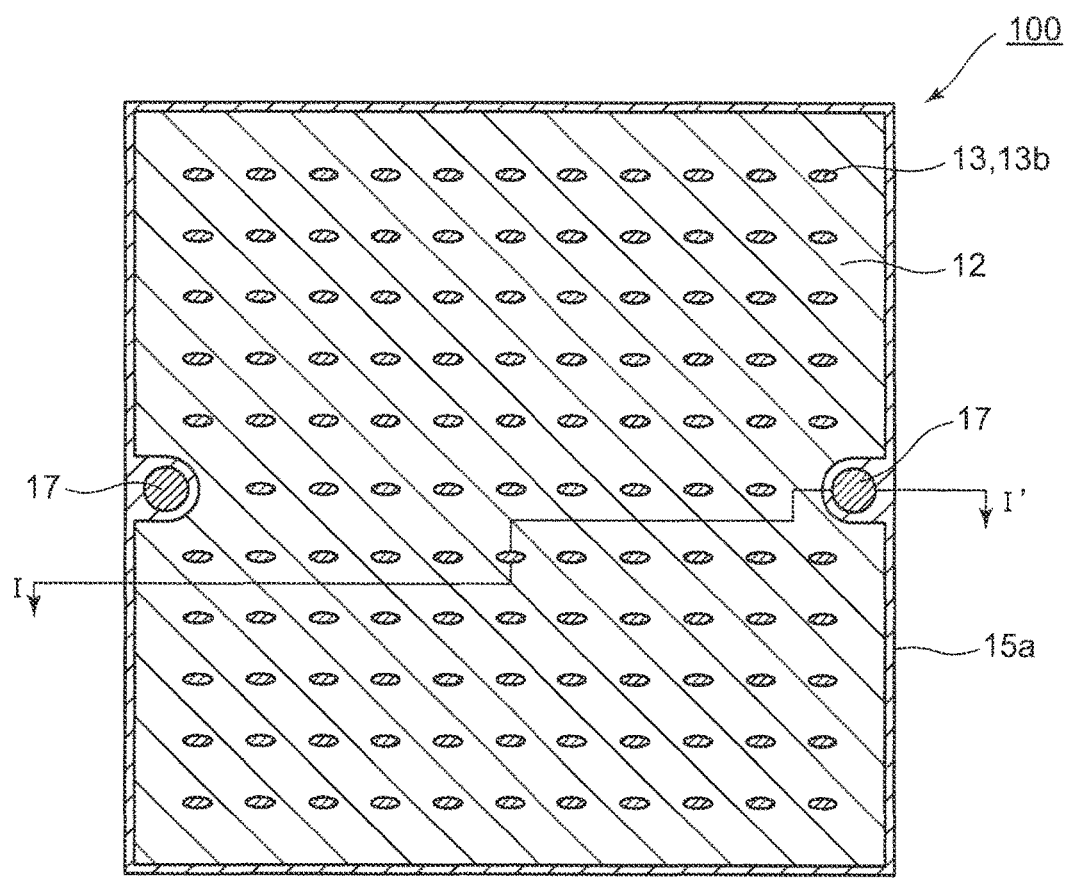
FIG. 3 is a schematic plane view illustrating the semiconductor light emitting element according to the first embodiment.
Figure 4:
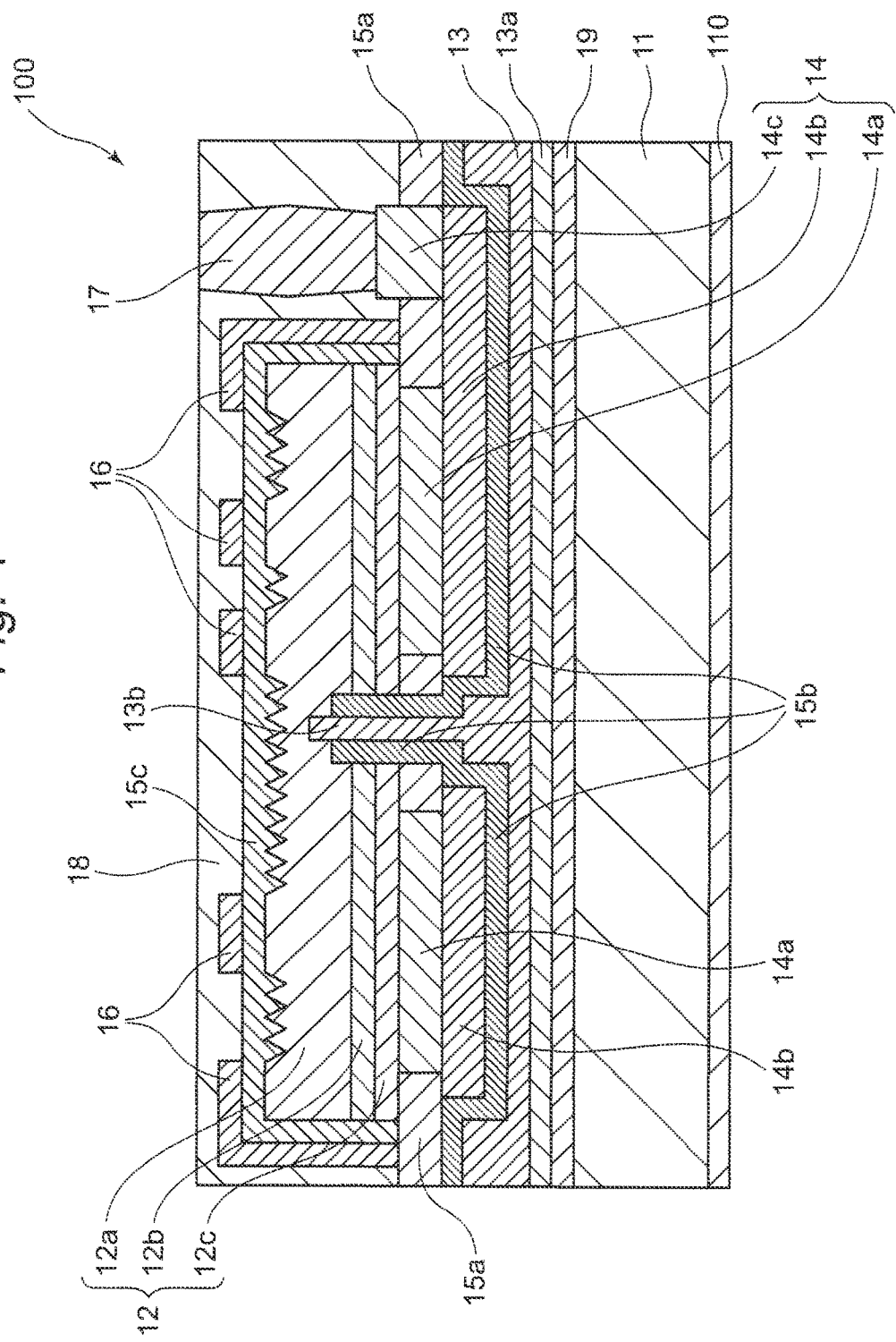
FIG. 4 is a schematic cross sectional view illustrating a modification of the semiconductor light emitting element according to the first embodiment.
Figure 5:
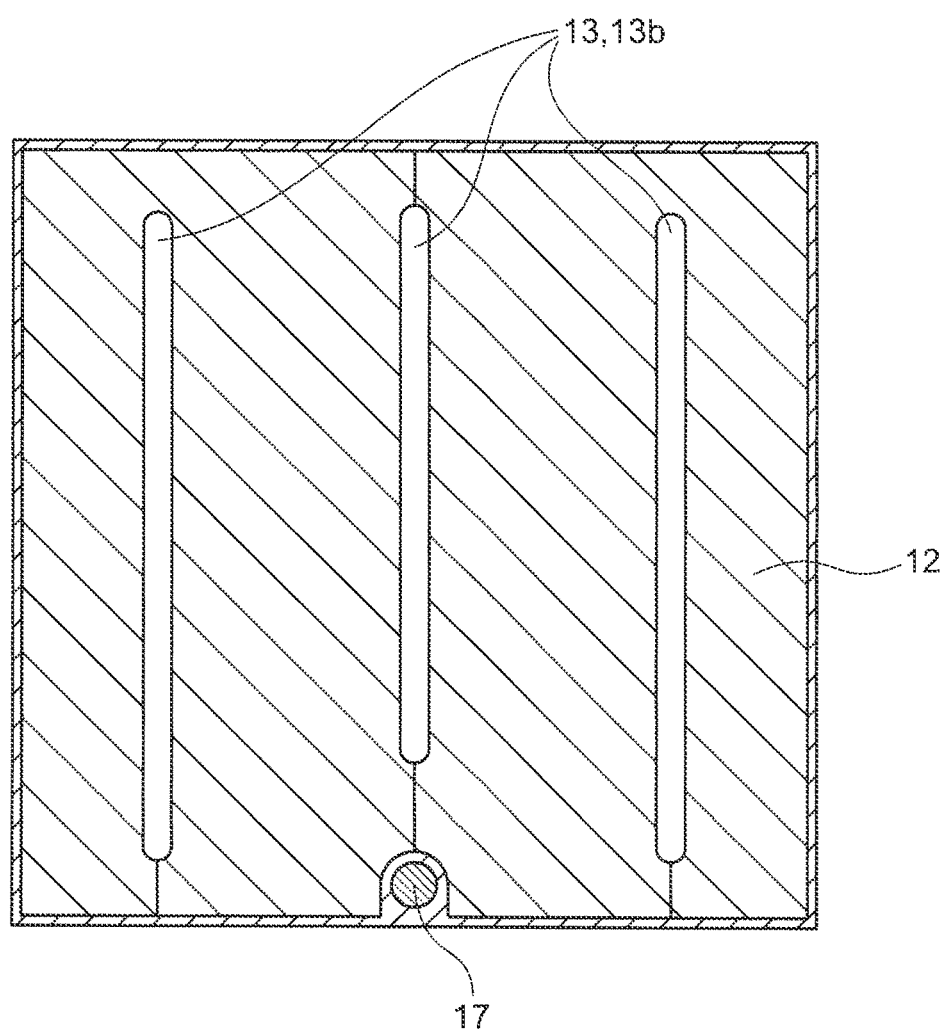
FIG. 5 is a schematic plane view illustrating a modification of the semiconductor light emitting element according to the first embodiment.

A semiconductor light emitting element according to a first embodiment is described below with reference to drawings. FIG. 1 is a schematic plane view illustrating the semiconductor light emitting element according to the first embodiment. FIG. 2 illustrates the semiconductor light emitting element according to the first embodiment, more specifically, is a schematic cross sectional view taken along line I-I' of FIG. 1. FIG. 3 illustrates the semiconductor light emitting element according to the first embodiment, more specifically, is a schematic plane view taken along line II-II' of FIG. 2 (a protective film 15c, a light shielding member 16, and a wavelength conversion member 18 are not illustrated). The line I-I' of FIGS. 1 and 3 illustrates the same line. FIG. 4 is a schematic cross sectional view illustrating a modification of the semiconductor light emitting element according to the first embodiment. FIG. 5 is a schematic plane view illustrating a modification of the semiconductor light emitting element according to the first embodiment. However, for the convenience sake of description, FIGS. 1 through 5 are not illustrated with the same reduced size. As used herein, a surface where a wavelength conversion member 18 of the semiconductor light emitting element 100 is formed is referred to as an upper surface. Further, as used herein, "on" used as, for example, on a layer, is not always used when something is formed so as to be contact on the upper surface but is also used when something is formed spaced above the upper surface including also a case where a member is disposed between members. Further, "in planar view" means that a semiconductor light emitting element 100 is viewed from a side where the wavelength conversion member 18 is provided, including a case of a permeable planar view.

Still further, a side where the wavelength conversion member 18 is provided is referred to as an upper surface as a light extracting surface side.

The semiconductor light emitting element 100 according to the first embodiment includes a support substrate 11, a semiconductor laminated structural body 12 including a first semiconductor layer 12a, a luminescent layer 12b, and a second semiconductor layer 12c, a first electrode 13, a second electrode 14 including a reflecting electrode 14a, a wiring electrode 14b, and a pad electrode 14c, insulating films 15a and 15b, a protective film 15c, a light shielding member 16, a bump 17, a wavelength conversion member 18, a first electrode adhesion layer 13a, a support substrate-side adhesion layer 19, and a rear face adhesion layer 110.

The semiconductor light emitting element 100 according to the first embodiment comprises, for example, as illustrated in FIG. 2, a support substrate-side adhesion layer 19 and a first electrode adhesion layer 13a in this order on the rectangular shaped support substrate 11 including a rear face adhesion layer 110 on a bottom surface thereof, the first electrode 13 on the first electrode adhesion layer 13a, and the second electrode 14 including the reflecting electrode 14a, the wiring electrode 14b, and the pad electrode 14c on the first electrode 13. An insulating film 15b is formed between the first electrode 13 and the second electrode 14 and thus the first electrode 13 is insulated from the second electrode 14. Further, a semiconductor laminated structural body 12, having a rectangular shape as similar to the support substrate 11, provided with the second semiconductor layer 12c, the luminescent layer 12b, and the first semiconductor layer 12a so as to be laminated together in this order is provided on the second electrode 14 except for the pad electrode 14c. More specifically, the semiconductor laminated structural body 12 has a substantial rectangular shape of almost the same size as the support substrate 11; however, a portion above the pad electrode 14c is removed in order to form the bump 17, so that, as illustrated in FIG. 1, center portions of two opposite sides of the semiconductor laminated structural body 12 are semicircularly inwardly curved in planar view (hereinafter the inwardly curved portion being referred to as "removed portion"). Further, as illustrated in FIG. 2, in the semiconductor laminated structural body 12, an upper surface of the first semiconductor layer 12a is formed into a rough surface or provided with an irregularity thereon. Still further, as illustrated in FIGS. 1 and 3, the second semiconductor layer 12c and the luminescent layer 12b are partially removed to be provided with a plurality of through-holes 13b for connecting the first semiconductor layer 12a to the first electrode 13. A wall surface of the through-hole 13b is angled so as to be gradually wider toward a side of the support substrate 11 and a wall surface of the first semiconductor layer 12a is provided with a step. A cross section of the through-hole 13b has almost an elliptical shape and the plurality of through-holes 13b are arranged in matrix so as to be equally spaced to each other in both of a horizontal direction and a vertical direction throughout a surface of the semiconductor laminated structural body 12.

In the second electrode 14, the reflecting electrode 14a is provided so as to cover almost all over the second semiconductor layer 12c. The wiring electrode 14b is provided so as to cover a surface of an opposite side of a surface contacting the second semiconductor layer 12c of the reflecting electrode 14a. The wiring electrode 14b is extended to the removed portion of the semiconductor laminated structural body 12. The wiring electrode 14b extended into the removed portion of the semiconductor laminated structural body 12 is provided with the pad electrode 14c formed thereon. As described above, the pad electrode 14c is provided on an area on the support substrate 11 where no semiconductor laminated structural body 12 is formed. Two pad electrodes 14c are provided on one semiconductor light emitting element 100 at positioned near the two opposed center portion of the semiconductor light emitting element 100 and near the edges of the element, respectively. As described above, the pad electrode 14c is preferably positioned on an area other than a corner portion of the semiconductor light emitting element 100. Further, each of the two pad electrodes 14c is provided with a bump 17 for connecting to the external power source formed thereon.

The first electrode 13 is formed on the first electrode adhesion layer 13a with an area larger than that of the semiconductor laminated structural body 12 and so as to cover almost throughout the semiconductor light emitting element 100 in planar view. The first electrode 13 having the area larger than that of the semiconductor laminated structural body 12, has a portion extending outside the semiconductor laminated structural body 12. Further, the first electrode 13 and the second electrode 14 are partially laminated in planar view. The first electrode 13 is connected to the first semiconductor layer 12a via the through-hole 13b. As described above, the through-hole 13b is formed into a hole of which width becomes narrower as going to the first semiconductor layer 12a from the second semiconductor layer 12c. The through-hole 13b is formed so as to penetrate the reflecting electrode 14a and the wiring electrode 14b of the second electrode 14 in addition to the second semiconductor 12c, the luminescent layer 12b, and the first semiconductor layer 12a of the semiconductor laminated structural body 12. The first electrode 13 and the second electrode 14, and the first electrode 13 and the second semiconductor 12c and the luminescent layer 12 are insulated each other by the insulating film 15b.

The insulating film 15b lying between the first electrode 13 and the second electrode 14 is formed so as to be extended into the through-hole to a position at which a portion of the wall surface of the first semiconductor layer 12a is covered. More specifically, the insulating film 15b within the through-hole 13b covers a wall surface of the second electrode 14, a wall surface of the second semiconductor layer 12c, a wall surface of the luminescent layer 12b, and a portion of a wall surface of the first semiconductor layer 12a. In the surface of the second semiconductor layer 12c, a portion where no reflecting electrode 14a is formed is provided with the insulating film 15a. Therefore, a surface of the second semiconductor layer 12c is covered by either one of the reflecting electrode 14a and the insulating film 15a. A surface of the semiconductor laminated structural body 12 except for the surface where the first electrode 13 and the second electrode 14 are formed, i.e., the side surfaces and the upper surface of the semiconductor laminated structural body 12, is covered by the protective film 15c.

A portion of the upper surface and the side surfaces of the semiconductor laminated structural body 12 are covered with the light shielding member 16 via the protective film 15c. The light shielding member 16 has an opening of a shape circulating a character N in planar view and the protective film 15c is exposed through the opening. The wavelength conversion member 18 is provided on the upper surface of the semiconductor laminated structural body 12, a portion of the upper surface not being covered by the light shielding member 16, so as to contact the upper surface of the semiconductor laminated structural body 12. The wavelength conversion member 18 may cover throughout the semiconductor laminated structural body 12. In the present embodiment, the wavelength conversion member 18 is provided so as to cover the light shielding member 16, the side surface of the bump 17, the protective film 15c exposing from the light shielding member 16, and the pad electrode 14c. An upper surface of the wavelength conversion member 18 has almost the same height as the bump 17 and the upper surface of the bump 17 is exposed from the wavelength conversion member 18. In the present embodiment, the wavelength conversion member 18 is provided such that the upper surface and the side surfaces thereof are perpendicular to each other and the semiconductor light emitting element 100 has a cubic shape or rectangular solid shape in its entire appearance.

Each configuration of the present embodiments is described below.

(Support Substrate 11)

As the support substrate, mainly, a Si substrate as well as a GaAs semiconductor substrate, or a conductive substrate made of, for example, a metal material of Cu, Ge, or Ni and a Cu—W composite material are exemplified. In addition thereto, a composite of a metal such as Cu—Mo, AlSiC, AlSi, AlN, SiC, Cu-diamond and a ceramic can also be employed. For example, a general inequity of the Cu—W and Cu—Mo can be represented, respectively, by $Cu_xW_{100-x}$ ($0 \le x \le 30$) $Cu_xMo_{100-x}$ ($0 \le x \le 50$). An advantage of Si to be employed here is inexpensive and easy to be subjected to a chipping operation. A preferable board thickness of the support substrate is about a range between 50 μm and 500 μm. By setting the board thickness of the support substrate in this range, the heat dissipation is expected to be improved. Further, use of the conductive substrate as the support substrate enables a power supply from the substrate side as well as the element can have a high electrostatic breakdown voltage and excellent heat dissipation. With the support substrate made of an opaque material such as Si and Cu (Cu—W) and excellent in the heat dissipation, a reflecting structure is provided between the above-mentioned support substrate and a semiconductor layer or within the semiconductor layer to thereby form a structure for extracting light from an side opposite to the support substrate. Accordingly, semiconductor light emitting element excellent in the heat dissipation and the light emitting characteristic can be structured.

Further, the support substrate and a bonding portion to be bonded with the support substrate can be formed by plating. The element may include no support substrate and may be directly mounted on a mounting portion of the light emitting device or a base.

(Semiconductor Laminated Structural Body 12)

The first semiconductor layer, the luminescent layer, and the second semiconductor layer for forming the semiconductor laminated structural body is not limited to any structure but, for example, may be structured with any one of an InAlGaP based semiconductor, an InP based semiconductor, an AlGaAs based semiconductor, a semiconductor made of a mixed crystal thereof, and a GaN based nitride semiconductor. More specifically, an example of the nitride semiconductor includes a III-V compound nitride semiconductor ($In_xAl_yGa_{1-x-y}N$ ($0 \le x$, $0 \le Y$, $X+Y \le 1$)) made of GaN, AlN, or InN, or a mixed crystal thereof. Further, B may be partially or entirely used as the group III element or N may be partially substituted mixed crystal substituted with P, As, or Sb as a group V element. The semiconductor layers are normally doped with either one of an n-type impurity of or a p-type impurity.

In the first semiconductor layer and the second semiconductor layer, the first semiconductor layer is either one of the n-type semiconductor layer or the p-type semiconductor layer and the second semiconductor layer is a semiconductor layer having a conductivity type opposite to that of the first semiconductor layer, i.e., either one of the p-type semiconductor layer or the n-type semiconductor layer. Preferably, the first semiconductor layer is the n-type semiconductor layer and the second semiconductor layer is the p-type semiconductor layer.

The semiconductor layer may have a single layer structure or may have a laminated structure such as a homostructure having a MIS junction, a PIN junction, or a PN junction, a heterostructure, or a double-heterostructure. In other words, the semiconductor layer may be an element in which the n-type semiconductor layer and the p-type semiconductor layer directly contact to each other to be formed into a light emitting portion or may be an element including an active layer between the n-type semiconductor layer and the p-type semiconductor layer to form the active layer into the light emitting portion (the luminescent layer).

The film thickness of each semiconductor layer is not limited to any thickness but is adjustable as required.

In the semiconductor laminated structural body 12 including the luminescent layer 12b, when the light shielding member 16 is provided therein, the light shielding member shields light from the luminescent layer 12. Therefore, the semiconductor laminated structural body 12 may be formed into any shape in planar view. In the present embodiment, the semiconductor laminated structural body 12 is substantially formed into a rectangular shape; however, may be formed into any shape including a circular shape, an elliptical shape, and a polygonal shape. Further, even when the light shielding member 16 is not provided, with the luminescent layer 12b being formed into any appropriate shape, a light emitting shape can be formed into the same shape as the shape of the luminescent layer 12b

Side surfaces of the semiconductor laminated structural body 12 are angled such that an area of the first semiconductor layer 12a becomes smaller than an area of the second semiconductor layer 12c in planar view. In other words, the side surfaces are formed into a normally tapered shape in the present embodiment. At the time, an angle of the corner portions made of the upper surface and the side surfaces of the semiconductor laminated structural body 12 is an obtuse angle, i.e., is slightly curved, breakage of the light shielding member 16 extending across the upper surface and the side surfaces of the semiconductor laminated structural body 12 can be suppressed. The side surface of the semiconductor laminated structural body 12 may be formed into a reverse taper shape so as to allow the area of the first semiconductor layer 12a to be larger than the area of the second semiconductor layer 12c. At the time, in the semiconductor laminated structural body 12, light can be extracted upwardly by reflecting the light with the side surfaces.

The upper surface of the first semiconductor layer 12a has a rough surface or formed with irregularity thereon. Accordingly, the light extraction efficiency thereof improves. Further, it is no longer necessary to form the rough surface or irregularity throughout the upper surface of the first semiconductor layer 12a. The rough surface or the irregularity is formed at least in an opening of the below described light shielding member 16, i.e., the upper surface of the first semiconductor layer 12a not being covered with the light shielding member 16.

(Light Shielding Member 16)

Preferably, the light shielding member is made of a material having a high reflectivity. The light shielding member can be formed of a single layer film or a laminated film made of a material containing at least one selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), aluminum (Al), silicone (Si), oxide thereof, or nitride thereof, a metal, or an alloy thereof. The light shielding member is also made of a material including both of the metal and an insulating film. The film thickness is not limited to any specific value but can be adjusted, as required, in consideration with a property attempted to be obtained. Further, for example, a resin containing a reflective material may also be used. Examples of the reflective material include $ZrO_2$, $Al_2O_3$, $TiO_2$ and $SiO_2$. Examples of the resin include a silicone resin, a modified silicone resin, an epoxy resin, a modified epoxy resin, and an acrylic resin. A distributed bragg reflector (DER) film is also employable.

The light shielding member 16 covers a portion of the upper surface and all the side surfaces of the semiconductor laminated structural body 12. In the present embodiment, the light shielding member 16 is integrally provided on a portion of the upper surface and all the side surfaces of the semiconductor laminated structural body 12; however, the light shielding member 16 provided on a portion of the upper surface and the side surfaces may be provided so as to be spaced from the semiconductor laminated structural body 12 as far as the light shielding member 16 covers the side surfaces of the semiconductor laminated structural body 12. In the present embodiment, the "integral" means that the light shielding member 16 on the upper surface and the light shielding member 16 on the side surfaces may be partially or entirely connected to each other. The light shielding member 16 covering the portion of the upper surface and the side surfaces of the semiconductor laminated structural body 12 may be made of the same material or a different material in both cases where the upper surface and the side surfaces are formed integrally therewith or spaced therefrom. As far as the same material is used, a degree of shielding of the light shielding member 16 can be made uniformly throughout the entire semiconductor light emitting element 100. Consequently, a contrast when emitting light becomes optimum. Further, a manufacturing process thereof can be simplified.

An opening having a shape in which a character N is enclosed by a circle is formed in the upper surface. The opening can be shaped into any appropriate shape such as a circle, an ellipse, a polygon, a character, a symbol, a drawing, and an illustration. Since the light shielding member 16 covers all the side surfaces of the semiconductor laminated structural body 12, the light from the side surfaces of the luminescent layer 12b can be prevented from emitting out. Therefore, no color irregularity is generated due to a mixture of the light of which wavelength is converted after passing through the wavelength conversion member 18 and the light emitted to a side surface direction from the luminescent layer 12b of which wavelength is not converted. The light emitted from the semiconductor laminated structural body 12 is emitted mainly upwardly and the wavelength of almost whole the light is converted by being passed through the wavelength conversion member as well as excessive light is shielded by the light shielding member 16, so that the light-emitting face can be made into a desired shape having a sharp outline.

For example, as illustrated in FIG. 4, when the upper surface of the first semiconductor layer 12a covered with the light shielding member 16 is made into a flat surface, light scattering in the flat surface can be suppressed. As a result thereof, light loss can be decreased to thereby improve the luminous efficiency.

(Wavelength Conversion Member 18)

The wavelength conversion member is made of a resin containing a phototransforming material for converting a portion of light from semiconductor light emitting element into light having a different wavelength. The phototransforming material is excited at least by the luminous wavelength from the luminescent layer to emit fluorescence light. Any publicly known fluorescent material, e.g., a YAG based fluorescent material, can be used as the phototransforming material. Examples of the resin includes, according to a purpose or use thereof, a silicon based resin such as a phenyl based silicone resin, a dimethyl based silicone resin, and a hard hybrid silicone resin and an epoxy based resin. A filler and a dispersing agent, in addition to the fluorescent material, can be contained in the resin. Accordingly, the light from the luminescent layer can be converted and the semiconductor light emitting element capable of emitting a desired light such as white and a warm white color.

The wavelength conversion member 18 may cover at lease the semiconductor laminated structural body 12 exposed from the light shielding member 16 in planar view. Further, preferably, the wavelength conversion member 18 covers at least a portion of the light shielding member 16. Preferably, the wavelength conversion member 18 is provided across the light shielding member 16 and the semiconductor laminated structural body 12 exposed from the light shielding member 16 along an outline of the shape of the opening of the light shielding member 16 in planar view. According to the above-mentioned preferred embodiment of the present embodiment, most of the portion of the light from the luminescent layer 12b is emitted out through the wavelength conversion member 18 covering the upper surface of the semiconductor laminated structural body 12 not covered by the light shielding member 16; however, some of the light passes through the wavelength conversion member 18 covering the light shielding member 16, so that the outline of the shape of the opening of the light shielding member 16 can be blurred. The adhesion property between the light shielding member 16 and the protective film 15c, eventually, the adhesion property of the light shielding member 16 to the semiconductor laminated structural body 12 improves. The wavelength conversion member 18 covers the protective film 15c covering the upper surface and the side surfaces of the semiconductor laminated structural body 12, the light shielding member 16, the pad electrode 14c, and the exposed surface of the bump 17. The wavelength conversion member 18 fills the opening of the light shielding member 16. The wavelength conversion member 18 includes an upper surface and side surfaces almost perpendicular to the upper surface and has a rectangular shape in planar view. The upper surface of the wavelength conversion member 18 is almost the same height as the upper surface of the bump 17. The upper surface of the bump 17 is exposed from the wavelength conversion member 18, so that the bump 17 can be connected to a wire at any position of the semiconductor light emitting element 100 in planar view. As a result thereof, the bump can be freely designed to be formed at any position. The surface of the wavelength conversion member 18 may be formed in to a rough surface. With the rough surface, when the light is emitted to the outside from the wavelength conversion member 18, the light is hardly reflected totally and thus can be emitted smoothly, resulting in obtaining improved light extraction efficiency.

The wavelength conversion member 18 may be formed into a plate shape. For example, the semiconductor laminated structural body 12 which is not covered by the light shielding member 16 is provided with a plate shaped wavelength conversion member 18 having an area larger than the semiconductor laminated structural body 12 formed thereon by using a resin for bonding.

(First Electrode 13 and Second Electrode 14)

The first electrode and the second electrode can be formed with a single film or a laminated film made of a metal and an alloy containing at least one selected from the group consisting of, for example, nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), aluminum (Al), silicon (Si), gold, (Au), oxides thereof, or nitrides thereof and transparent conductive oxide such as ITO, ZnO, $In_2O_3$. A film thickness thereof is not limited to a specific value but can be adjusted, as required, in consideration with the property to be attempted to obtain.

(Reflecting Electrode 14a)

The reflecting electrode 14a is intended to efficiently reflect the light from the luminescent layer 12b, so that the reflecting electrode 14a is preferably formed with a wide area almost all over the entire surface of the second semiconductor layer 12c. Here, "almost all over" means an area other than an outer edge of the second semiconductor layer 12c and an outer edge of the exposed portion of the first semiconductor layer 12a, e.g., preferably, equal to or more than 70% and equal to or less than 80% of the area of the upper surface of the semiconductor light emitting element 100. Accordingly, by making the maximum contact area of the reflecting electrode 14a with respect to the second semiconductor layer 12c, a contact resistance can be lowered and a drive voltage can be decreased. Further, the light from the luminescent layer 12b can be reflected by almost the entire area of the second semiconductor layer 12c and thus the light extraction efficiency can be improved. The reflecting electrode 14a is provided with the through-hole 13b for forcing the first electrode 13 into conduction with the first semiconductor layer 12a formed thereon, so that the reflecting electrode 14a has a such shape that a plurality of holes are provided therein.

Preferably, the reflecting electrode is formed of a single layer film or a laminated film made of a metal selected from the group consisting of Al, Rh, and Ag or an alloy thereof in order to cause the light of the luminescent layer to be reflected. More preferably, the reflecting electrode contains a metal film containing Ag or an Ag alloy.

Side surfaces and a lower side (i.e., a surface of a side of the support substrate) of the reflecting electrode may be completely covered by the other metal-containing layer as a cover electrode to be provided for the sake of migration prevention. In the present embodiment, the lower side the reflecting electrode is covered with the wiring electrode and the side surfaces of the reflecting electrode is covered with the insulating film, so that those electrodes take a roll of cover electrode.

(Wiring Electrode 14b)

The lower side of the reflecting electrode 14a is provided with the wiring electrode 14b. The wiring electrode 14b covers almost the entire surface of the reflecting electrode 14a, extends to the outside of the semiconductor laminated structural body in order to connect the reflecting electrode 14a with the external power source, and has the area exposing from the semiconductor laminated structural body in planar view. Preferably, the wiring electrode 14b has a function to reflect the light from the luminescent layer 12b and further is made of a material having a high conductivity.

(Pad Electrode 14c)

The pad electrode 14c is formed on the wiring electrode 14b extending to the outside of the semiconductor laminated structural body 12 in planar view. The bump 17 for establishing a connection with the external power source and the wiring is formed on the upper surface of the pad electrode 14c. In the present embodiment, two pad electrodes 14c are positioned in an area other then the corner portion of the semiconductor light emitting element 100 and on the sides of the edges of the element so as to sandwich the semiconductor laminated structural body 12, wherein the opposed pad electrodes have a circular shape of the same size. Preferably, the pad electrodes 14c are provided on the area other than the corner portion, more preferably, in consideration with a shielding of the light emission by the wire for the connection with the outside, the pad electrodes are preferred to be positioned around the semiconductor light emitting element 100 but also may be formed on the center area of the semiconductor light emitting element 100. According to the size of the semiconductor light emitting element 100 and the shape of the semiconductor laminated structural body 12, the number and the position of pad electrodes can be changed as required.

(First Electrode 13)

The first electrode 13 is larger than the semiconductor laminated structural body 12 and is provided widely almost throughout the entire surface of the semiconductor light emitting element 100. The first electrode 13 is insulated by the insulating film 15b in order to establish conduction with the first semiconductor layer 12a, is provided so as to extend from the lower side of the second electrode 14 to portions of the side surfaces of the wiring electrode 14b, the reflecting electrode 14a, the second semiconductor layer 12c, the luminescent layer 12b, and the first semiconductor layer 12a to be finally contacted with the first semiconductor layer 12a. The first electrode 13 fills the through-hole 13b and the upper surface and a portion of the side surface continuous to the upper surface of the first electrode 13 within the through-hole 13b are exposed from the insulating film 15b to be brought into contact with the first semiconductor layer 12a in an upper surface of the first electrode 13 and at a portion of the side surface exposed from the insulating film 15b. With the above-mentioned configuration, within the through-hole 13b, since a contact area between the first electrode 13 and the first semiconductor layer 12a becomes larger than the area of all the side surfaces of the first electrode 13 covered by the insulating film 15b, so that it becomes easy for the current to spread and thus a Vf (i.e., a forward voltage) decreases. Further, within the through-hole 13b, a step is formed on an edge portion of the insulating film 15b of the wall surface of the first semiconductor layer 12a.

In the present embodiment, a plurality of elliptical shaped through-holes 13b are positioned in matrix at equal intervals in planar view and the first electrode 13 is connected to the first semiconductor layer 12a at a plurality of portions via the plurality of through-holes 13b. As a result thereof, current can be injected to the first semiconductor layer 12a from a plurality of portions, so that the current to be injected to the luminescent layer can be controlled to a uniform density, the Vf (i.e., the forward voltage) can be decreased, and, therefore, the light can be emitted uniformly. The first electrode 13 is disposed between the first electrode adhesion layer 13a and the insulating film 15b to be formed into one piece so as to be electrically conducted to each other. Therefore, the first electrode 13 is provided at least one pad electrode. Further, a plurality of through-holes 13b can be dispersed in a small area and thus the light-emitting area can be kept sufficiently large without decreasing the light-emitting area.

The shape of the through-hole 13b in planar view is not limited to the elliptical shape but can be formed into any arbitrary shape such as a circular shape, a polygonal shape, a linear shape, and a curved shape and the through-holes 13b can be made into different shapes or the plurality of through-holes 13b can be connected to each other. If the area of the through-hole 13b is too small, the Vf may become higher. Therefore, the shape of the through-hole 13b may be formed into the elliptical shape or, for example, as illustrated in FIG. 5, may be formed into a linear shape so as to be able to be slightly larger than the circular shape. The number and the positions of the through-holes 13b can be changed, as required, according to sizes or shapes of the semiconductor laminated structural body 12 and the light shielding member 16. Therefore, not only the positioning in matrix but also a line symmetry positioning, a point symmetry positioning, and positioning by ununiform distances may also be employed.

Preferably, the first electrode 13 is configured with a material capable of achieving a good ohmic contact with the first semiconductor layer 12a since the first electrode 13 is brought into contact with the first semiconductor layer 12a. Further, since the light from the semiconductor laminated structural body 12 is irradiated to the first electrode 13 in the through-hole 13b via the insulating film 15b, the first electrode 13 is preferably made of a material which reflects light emitted from the luminescent layer 12b in a manner as similar to the second electrode 14. Therefore, the material of the first electrode 13 is selected in consideration with the ohmic contact with the first semiconductor layer 12a and a point if the first electrode 13 can reflect the light emitted from the luminescent layer 12b. Examples of the material of the first electrode 13 include Al and an Al alloy.

(Insulating Layer 15a and 15b)

Examples of the insulating film and the protective film include an oxide film, a nitride film, or an oxynitride film containing at least one element selected from the group consisting of Si, Ti, V, Zr, Nb, Hf, Ta, and Al. More specifically, $SiO_2$, $ZrO_2$, SiN, SiON, BN, SiC, SiOC, $Al_2O_3$, AlN, AlGaN are exemplified. The protective film may be a single layer film or a laminated film made of a single material or may be a laminated film made of different materials. The protective film may be a distributed bragg reflector (DBR) film.

The insulating layer 15a is positioned so as to fill inbetween the reflecting electrode 14a and the pad electrode 14c in planar view. The insulating layer 15b is provided between the first electrode 13 and the second electrode 14, more specifically, between the first electrode 13 and the wiring electrode 14b and, within the through-hole 13b, extends from a lower side of the wiring electrode 14b to the first semiconductor layer 12a to cover a portion of side surfaces of the first electrode 13, the wiring electrode 14b, the reflecting electrode 14a, the second semiconductor layer 12c, the luminescent layer 12b, and the first semiconductor layer 12a. Since the insulating layer 15b insulates the first electrode from the second electrode, the spatial configuration of the electrode can be achieved.

(First Electrode Adhesion Layer 13a)

The first electrode is connected to the support substrate-side adhesion layer by the first electrode adhesion layer formed almost throughout the lower surface of the first electrode. A lamination of the first electrode adhesion layer and the support substrate-side adhesion layer is formed into a bonding member. A material which can be used for the first electrode can be used for the first electrode adhesion layer and, in addition thereto, a metal such as Si, Au, Su, Pd, and In can also be used as well as a single layer, laminated layer, and an alloy thereof can be used. Preferably, the first electrode adhesion layer includes a bonding layer, a barrier layer, and a eutectic layer. The first electrode adhesion layer can have both of a function of connection and a function of power supply as similar to the first electrode. An Au—Au connection of a connecting surface between the first electrode adhesion layer and the support substrate-side adhesion layer can achieve a strong heat resistance and, therefore, can achieve a highly reliable semiconductor light emitting element.

(Support Substrate-Side Adhesion Layer 19)

The support substrate-side adhesion layer 19 is formed almost all over the upper surface of the support substrate 11 in order to be connected to an ohmic electrode and the first electrode adhesion layer of the support substrate 11 and can be made of the same material as the first electrode adhesion layer. Preferably, the support substrate-side adhesion layer 19 includes the bonding layer, the barrier layer, and the eutectic layer. Preferably, when the support substrate-side adhesion layer 19 is formed into a laminated structure made of a metal, when the support substrate-side adhesion layer 19 is made of the first electrode adhesion layer and Au, the uppermost surface is preferably the Au for the sake of the Au—Au connection with the first electrode adhesion layer.

(Rear Face Adhesion Layer 110)

The rear face adhesion layer is formed on a surface opposite to a surface where the support substrate-side adhesion layer 19 of the support substrate is formed and functions as the ohmic electrode as well as serves as a layer for mounting the semiconductor light emitting element on the mounting substrate. The rear face adhesion layer can be formed into a layer containing a metal such as $TiSi_2$, Ti, Pt, Ru, Au, and Su or a laminated structure thereof. It is possible to use materials similar to those of the first electrode adhesion layer and the support substrate-side adhesion layer. Alternatively, a resin may be used.

Second Embodiment

Figure 6:
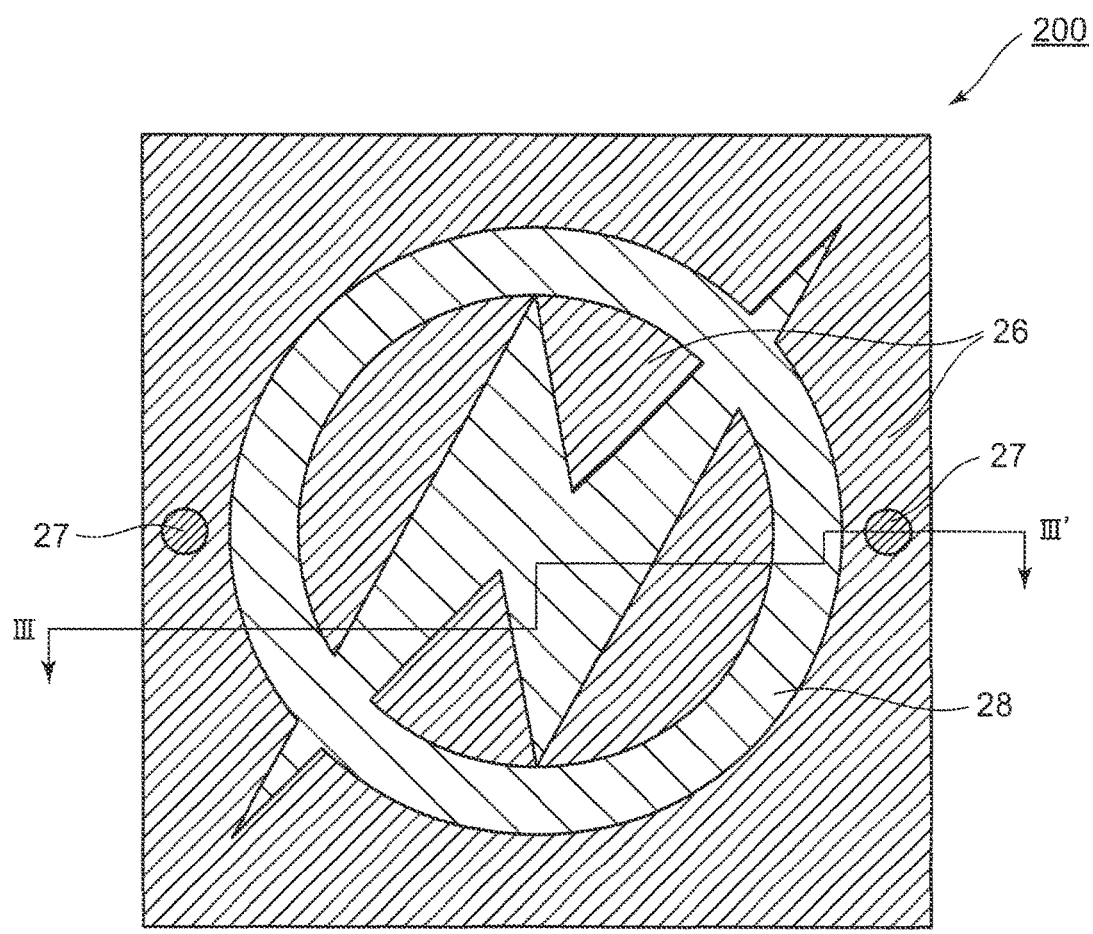
FIG. 6 is a schematic plane view illustrating a semiconductor light emitting element according to a second embodiment.
Figure 7:
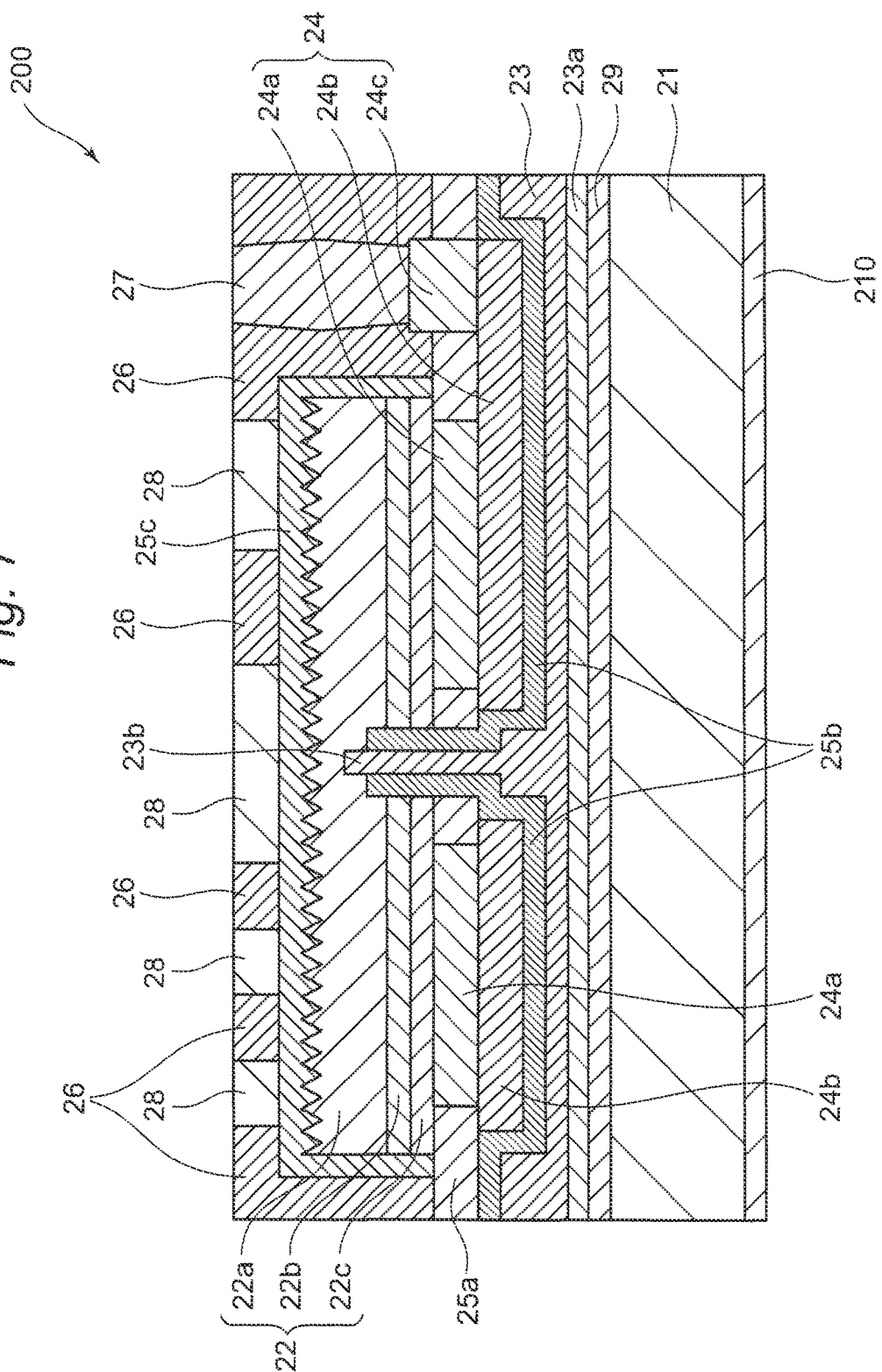
FIG. 7 is a schematic cross sectional view illustrating the semiconductor light emitting element according to the second embodiment.
Figure 8:
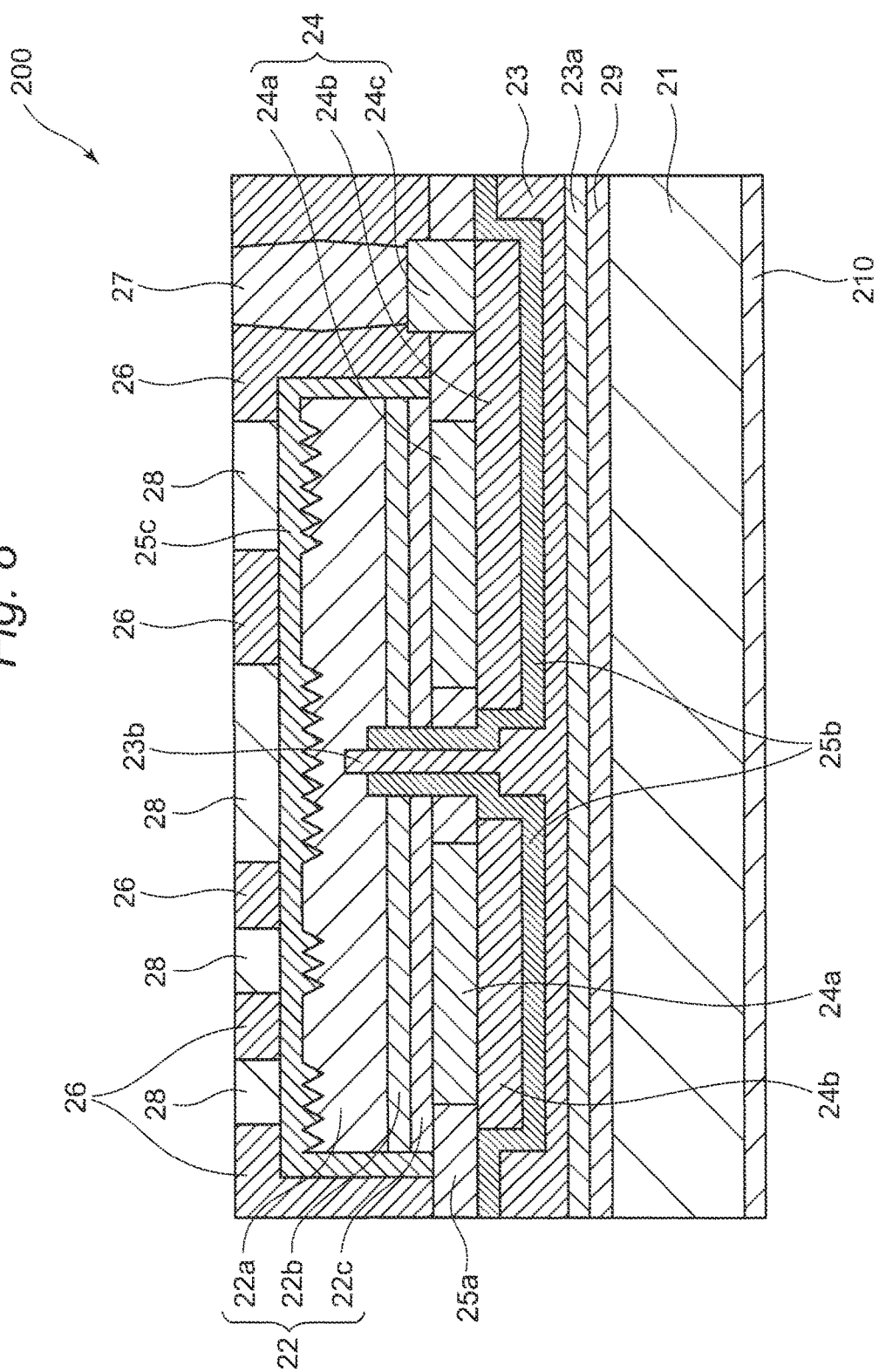
FIG. 8 is a schematic cross sectional view illustrating a modification of the semiconductor light emitting element according to the second embodiment.

A semiconductor light emitting element according to a second embodiment is described below. FIG. 6 is a schematic plane view illustrating the semiconductor light emitting element according to the second embodiment. FIG. 7 illustrates semiconductor light emitting element according to the second embodiment and is a schematic cross sectional view taken along line of FIG. 6. FIG. 8 is a schematic cross sectional view illustrating a modification of the semiconductor light emitting element according to the second embodiment. However, for the convenience sake for description, FIGS. 6 through 8 are not equally scaled. A semiconductor light emitting element 200 according to the second embodiment is substantially the same as the first embodiment except for shapes and positions of the light shielding member 26 and the wavelength conversion member 28.

The semiconductor light emitting element 200 according to the second embodiment is provided with the light shielding member 26 covering a portion of the upper surface and side surfaces of the semiconductor laminated structural body 22 so as to include an opening of a shape enclosing a character N by a circle in the upper surface of the semiconductor laminated structural body 22. The wavelength conversion member 28 is provided so as to be filled in the openings of the light shielding members 26. In other words, the upper surface of the semiconductor laminated structural body 22 not covered by the light shielding member 26 is covered by the wavelength conversion member 28 via the protection film 25c. The upper surface of the light shielding member 26, the upper surface of the wavelength conversion member 28, and the upper surface of the bump 27 are almost the same height and the upper surface of the light shielding member 26 is exposed from the wavelength conversion member 28. The upper surface and side surfaces of the light shielding member 26 are perpendicular to each other such that an outer appearance of the semiconductor light emitting element 200 substantially becomes a rectangular solid shape. Each of two bumps 27 is provided at an edge portion of the semiconductor light emitting element 200 of the outside of a circle enclosing the character N of the wavelength conversion member 28 and around a center portion of the two opposed sides.

The upper surface of the first semiconductor layer 22a is formed into a rough surface or a surface including irregularity.

Only the upper surface of the first semiconductor layer 22a not covered by the light shielding member 26 can be formed into the rough surface or the surface formed with the irregularity and the upper surface of the first semiconductor layer 22a covered by the light shielding member 26 is formed into a flat surface.

With the above-mentioned configuration, the light shielding member 26 resides around the wavelength conversion member 28 and all the side surfaces of the wavelength conversion member 28 is covered by the light shielding member 26. Therefore, the light from the luminescent layer 22b is emitted out only from the upper surface of the semiconductor laminated structural body 22 and the upper surface of the wavelength conversion member 28. As a result thereof, the color irregularity can be suppressed. Therefore, if the wavelength conversion member 28 is formed into any appropriate shape, the shape can be more clearly illuminated because of a good directivity of light emission.

Third Embodiment

Figure 9:
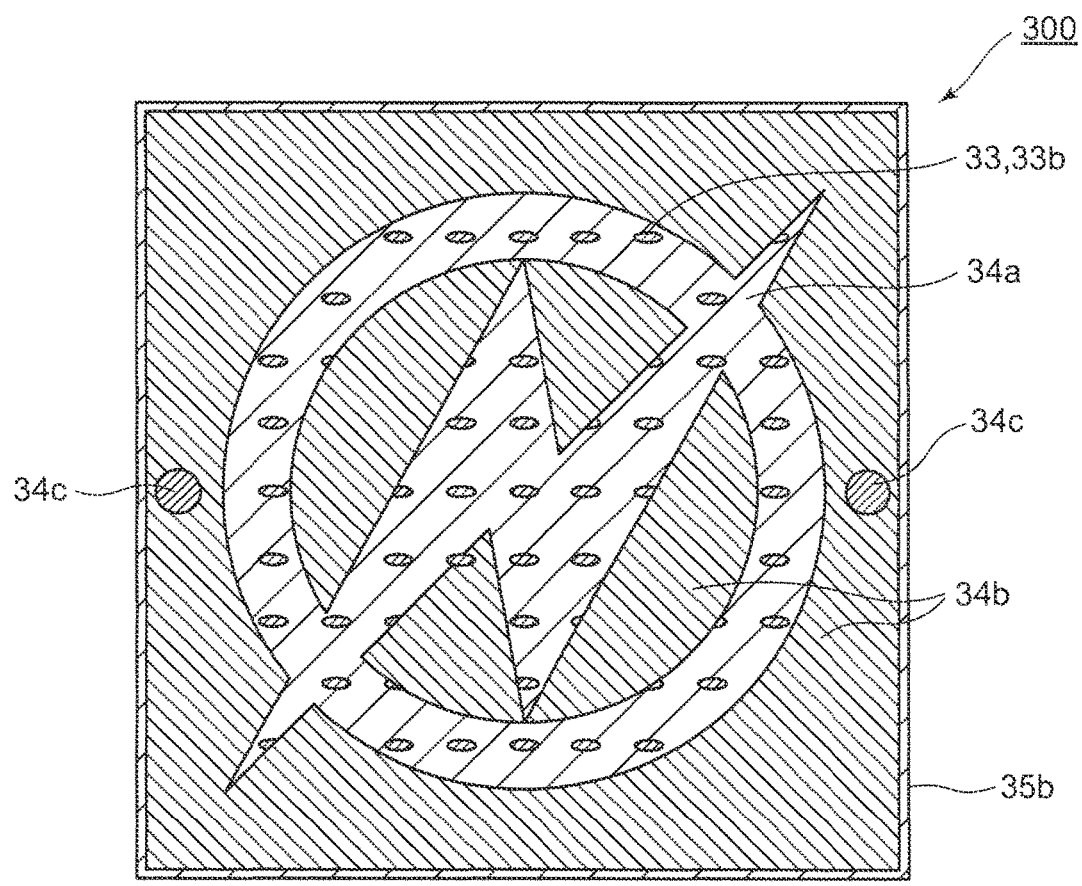
FIG. 9 is a schematic plane view illustrating a semiconductor light emitting element according to a third embodiment.

Now, a semiconductor light emitting element according to a third embodiment is described below. FIG. 9 is a lateral profile illustrating a shape of the reflecting electrode 34a in the semiconductor light emitting element according to the third embodiment. Here, the lateral profile is a cross sectional in parallel with the upper surface of the support substrate. A semiconductor light emitting element 300 according to the third embodiment is substantially identical to the first embodiment except that a shape of the reflecting electrode 34a differs. The lateral profile does not illustrates the semiconductor laminated structural body, the insulating film, the protective film, the light shielding member, the bump, and the wavelength conversion member which, however, are similar to those of the first embodiment.

In the semiconductor light emitting element 300 according to the third embodiment, the reflecting electrode 34a has a flat surface of a shape similar to the opening of the light shielding member 36, i.e., a shape enclosing the character N with a circle, and thus, when the reflecting electrode 34a is viewed through the reflecting electrode 34a from the light-emitting face, the reflecting electrode 34a is laminated with the opening of the light shielding member 36. The wiring electrode 34b having a rectangular shape as similar to that of the first embodiment is provided at the lower side of the reflecting electrode 34a with an area larger than that of the reflecting electrode 34a. In order to form the through-hole 33b for connecting the first electrode 33 lower than the wiring electrode 34b with the first semiconductor layer 32a, the reflecting electrode 34a and the wiring electrode 34b are provided with a plurality of elliptical holes in a uniformly distributed manner. The through-hole 33b may be formed only in a portion where the reflecting electrode 34a is formed. An area on the wiring electrode 34b and where no reflecting electrode 34a is formed is provided with an insulating film (not illustrated in FIG. 9). The semiconductor laminated structural body is formed on the reflecting electrode 34a and the insulating film into a substantially rectangular shape as similar to that of the semiconductor light emitting element 300.

Current is supplied from the reflecting electrode 34a contacting with the second semiconductor layer 32c to the semiconductor laminated structural body 32. Therefore, the current mainly flows in a thickness direction across the second semiconductor layer 32c to which the reflecting electrode 34a is brought into contact to be injected into the luminescent layer 32b, so that a light emitting area becomes the similar shape as that of the reflecting electrode 34a. Therefore, the shape of the wiring electrode 34b does not affect on the shape of the light emitting area. However, the shape of the wiring electrode 34b may be formed into the same shape as the reflecting electrode 34a or may be formed into different shape from the reflecting electrode 34a. With the light shielding member 36, more clear light emitting shape can be realized; however, with the above-mentioned configuration, an arbitrary light emitting shape can be created according to the reflecting electrode 34a even without the light shielding member 36.

Fourth Embodiment

Figure 10:
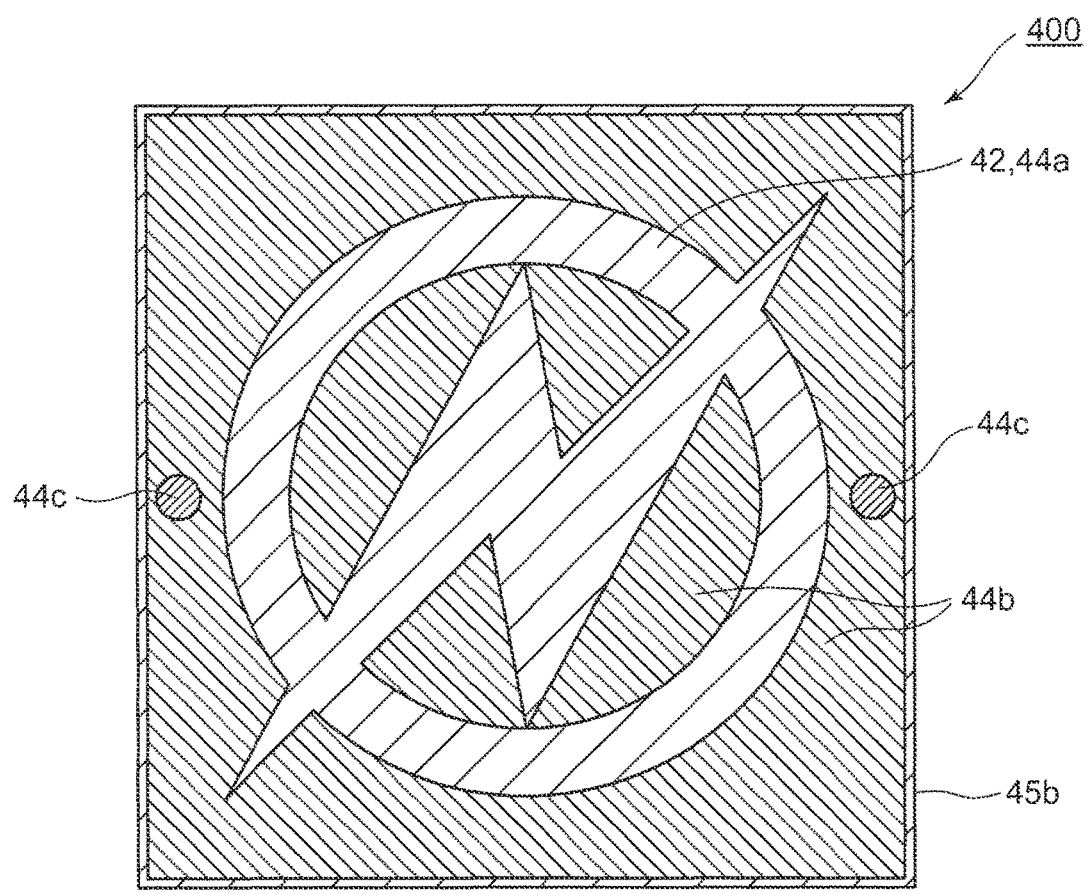
FIG. 10 is a schematic plane view illustrating a semiconductor light emitting element according to a fourth embodiment.

Now, a semiconductor light emitting element according to a fourth embodiment is described below. FIG. 10 is a schematic plane view illustrating the semiconductor light emitting element according to the fourth embodiment. A semiconductor light emitting element 400 according to the fourth embodiment is substantially identical to the first embodiment except that the shapes of the semiconductor laminated structural body 42 and the reflecting electrode 44a differs. In the schematic plane view, the insulating film, the protective film, the light shielding member, the bump, the wavelength conversion member are omitted.

In the semiconductor light emitting element 400 according to the fourth embodiment, a semiconductor laminated structural body 42 and a reflecting electrode 44a having substantially the same shape are laminated together in planar view, each having a shape enclosing the character N with a circle. Side surfaces of the semiconductor laminated structural body 42 are provided with the light shielding members 46 via the protective film 45c and the semiconductor laminated structural body 42 not covered by the light shielding member 46 is covered by the wavelength conversion member (not illustrated). Therefore, in the semiconductor light emitting element 400 according to the fourth embodiment, the surface of the semiconductor laminated structural body 42 is covered by either one of the light shielding member 46 and the wavelength conversion member.

Accordingly, by forming the semiconductor laminated structural body 42 (i.e., the luminescent layer 42b) into a desired shape, the semiconductor laminated structural body 42 emits light with a shape of the luminescent layer 42b identical to the shape of the semiconductor laminated structural body 42, so that a clear light emitting shape can be achieved. Further, if at least the side surfaces of the semiconductor laminated structural body 42 are coated with the light shielding member 46, a wavelength of the light from the luminescent layer 42b is converted only in the upper surface direction of the wavelength conversion member 48 covering the semiconductor laminated structural body 42, so that the color irregularity can be improved and thus more clear light emitting shape can be realized.

A method for manufacturing the semiconductor light emitting element 100 according to the first embodiment of the present invention is described below with reference to the drawings. FIGS. 11 through 15 are schematic views illustrating a process of a method for manufacturing the semiconductor light emitting element according to the first embodiment. The process of the manufacturing method is performed in the order of FIGS. 11A through 11F, FIGS. 12A through 12D, FIGS. 13A through 13D, FIGS. 14A through 14D, and FIGS. 15A through 15D.

<Formation of Semiconductor Laminated Structure>

A wafer of a growth substrate 10 is prepared. The growth substrate 10 is formed of a material suitable for causing the semiconductor laminated structural body to be epitaxially grown and a size and a thickness of the substrate are not limited to any size and thickness. Examples of the substrate suitable for the epitaxial growth of the nitride semiconductor include an insulating substrate such as sapphire and spinel, a transparent substrate, and a conductive substrate such as SiC, a nitride semiconductor (e.g., GaN), and CuW. The surface of the growth substrate 10 may include an irregularity thereon. The sapphire substrate 10 is placed within a MOCVD apparatus to cause, as illustrated in FIG. 11A, the first semiconductor layer 12a, the luminescent layer 12b, and the second semiconductor layer 12c are grown in this order on the surface of the sapphire substrate having the irregularity, thereby forming the semiconductor laminated structure.

<Formation of Reflecting Electrode 14a>

As illustrated in FIG. 11A, a reflecting electrode 14a having been patterned into a predetermined shape on the surface of the second semiconductor layer 12c is formed. Thus patterned reflecting electrode 14a has a hole for the through-hole 13b (not illustrated). To enlarge an illumination area by a current insertion, the reflecting electrode 14a is formed almost throughout the entire surface of the second semiconductor layer 12c. The reflecting electrode 14a is an electrode to be formed on a side at which the light is reflected, so that the reflecting electrode 14a is configured to have an electrode structure capable of reflecting light, more specifically, to have a reflective layer having a high reflectance. The reflecting electrode 14a preferably includes the reflecting layer on a side contacting the second semiconductor layer. However, for example, the reflecting electrode 14a may be formed into a multilayered structure in which, for example, the bonding layer and the reflecting layer are laminated in this order via a thin film bonding layer through which light transmits.

<Formation of Insulating Film 15a>

As illustrated in FIG. 11B, the insulating film 15a is formed on the second semiconductor layer 12c exposing from the reflecting electrode 14a. For example, the reflecting electrodes 14a may be provided side by side or may be spaced to each other. The insulating film 15a can be provided so as to cover a portion of the reflecting electrode 14a. The reflecting electrode 14a selectively provided on the surface of the second semiconductor layer 12c is conducted to the second semiconductor layer 12c.

<Formation of Wiring Electrode 14b>

As illustrated in FIG. 11C, the wiring electrode 14b is formed substantially throughout the entire surface of the reflecting electrode 14a and the insulating film 15a. The wiring electrode 14b is provided with holes for through-holes 13b in a similar manner as the reflecting electrode 14a. The reflecting electrode 14a and the wiring electrode 14b are formed such that the holes for the through-holes 13b of the wiring electrode 14b and the holes for the through-hole 13b of the reflecting electrode 14a overlaps to each other <Formation of Through-Hole 13b (Etching of Semiconductor Laminated Structure) (1)>

Except for the area for the through-hole 13b, a resist is provided on upper surfaces of the insulating film 15a and the wiring electrode 14b, followed by etching. Portions of the insulating film 15a, the second semiconductor layer 12c, the luminescent layer 12b, and the first semiconductor layer 12a are removed via resist opening by etching and, as illustrated in FIG. 11D, the first semiconductor layer 12a is exposed to form the through-hole 13b. At the time, the first semiconductor layer 12a may be etched until an interface with the luminescent layer 12b is exposed or may be etched into the first semiconductor layer 12a.

<Formation of Insulating Film 15b>

As illustrated in FIG. 11E, the insulating film 15b is formed on the wiring electrode 14b, the insulating film 15a, the reflecting electrode 14a, the second semiconductor layer 12c, the luminescent layer 12b, the first semiconductor layer 12a which, in combination, forms the wall surface of the through-hole 13b, in a manner to cover all the surfaces thereof. With the insulating film 15b, the first electrode is insulated from the second electrode, the second semiconductor layer 12c, and the luminescent layer 12b.

<Formation of Through-Hole 13b (Etching of Semiconductor Laminated Structure) (2)>

As illustrated in FIG. 11F, in the area for the through-hole 13b, the insulating film 15b is removed by etching such that the first semiconductor layer 12a is exposed. Further, in order to avoid the damage upon etching of the insulating film 15b, a portion of the first semiconductor layer 12a is removed.

<Formation of First Electrode 13>

Figure 12A:
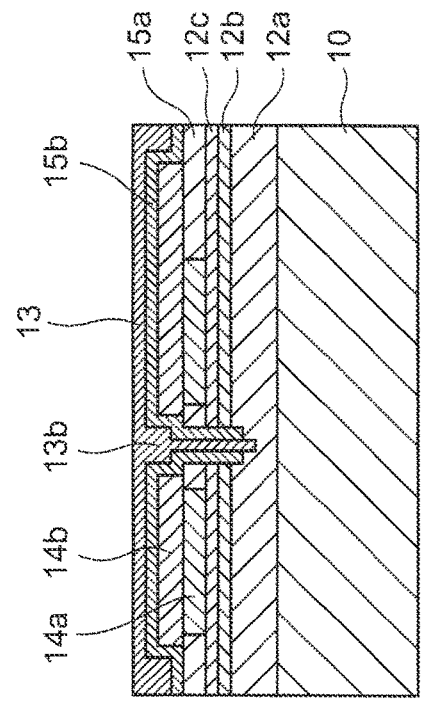
FIG. 12 is a schematic view illustrating a process of a method for manufacturing the semiconductor light emitting element according to the first embodiment, FIG. 12A showing the first electrode 13 formed on the insulating film, FIG. 12B showing the upper surface of the first electrode planarized via a mechanical polish processing or polishing, FIG. 12C showing the first electrode adhesion layer formed on the planarized first electrode, and FIG. 12D showing a support substrate with a support substrate-side adhesion layer and the first electrode adhesion layer bonded to each other via thermocompression bonding.
Figure 12B:
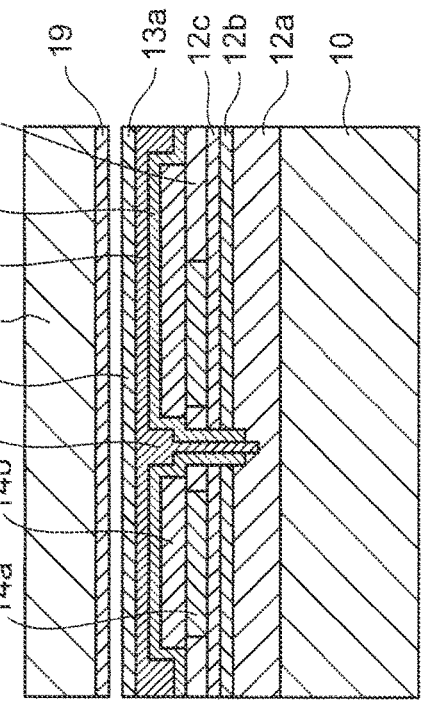

As illustrated in FIG. 12A, the first electrode 13 is formed on the insulating film 15b. At the time, the first electrode is embedded into the through-hole 13b to be brought into contact with the exposed surface of the first semiconductor layer 12a. Subsequently, the upper surface of the first electrode 13 is planarized via the chemical mechanical polish (CMP) processing or is polished (FIG. 12B). In the first electrode 13, a recessed portion is formed at a position of the hole because of the through-hole 13b; however, since the surface of the first electrode 13 is planarized via polishing or the like, voids can be prevented from being generated between the adhesion layers in the subsequent bonding process.

<Formation of First Electrode Adhesion Layer>

Figure 12C:
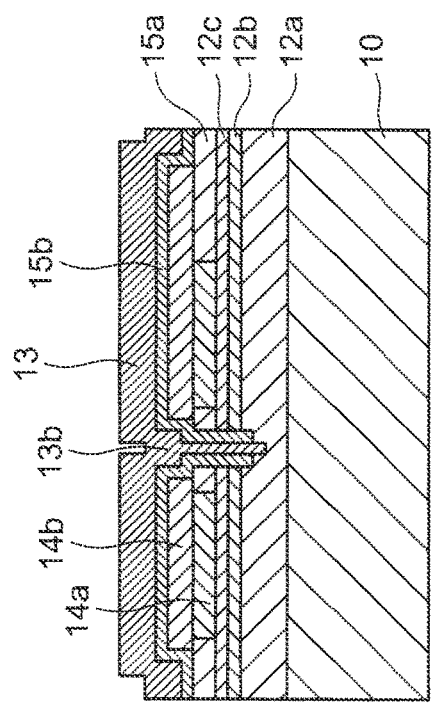

As illustrated in FIG. 12C, the first electrode adhesion layer 13a is formed on the planarized first electrode 13 in order to bond the first electrode 13 to the support substrate-side adhesion layer. Since the surface of the first electrode 13 is planarized, the first electrode adhesion layer 13a formed thereon becomes flat.

<Bonding Process>

Figure 12D:
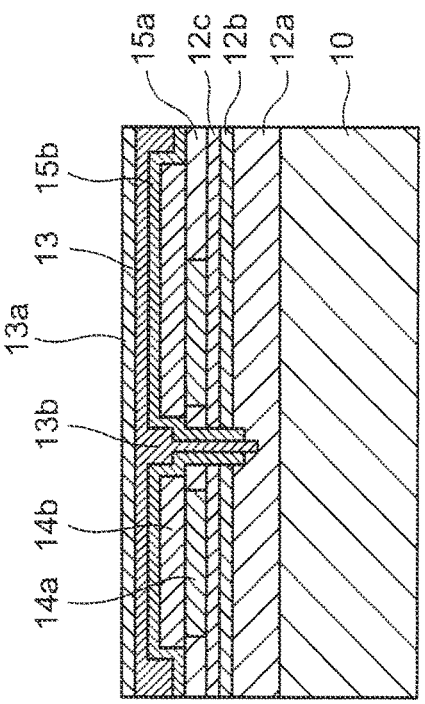
Figure 13A:
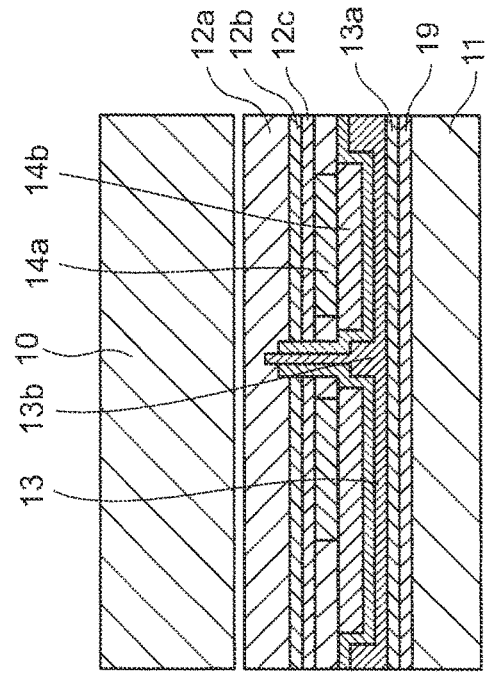
FIG. 13 is a schematic view illustrating a process of a method for manufacturing the semiconductor light emitting element according to the first embodiment, FIG. 13A showing the support substrate with the support substrate-side adhesion layer and the first electrode adhesion layer bonded to each other via thermocompression bonding, FIG. 13B showing the growth substrate 10 removed by irradiating solid laser containing an excimer laser and a femtosecond laser from a side of the growth substrate or by polishing, FIG. 13C showing the upper surface of the first semiconductor layer provided with a resist and the following etching via RIE, thereby dividing into a plurality of semiconductor laminated structural bodies constituting respective semiconductor light emitting elements, and FIG. 13D showing the surface of the first semiconductor layer formed into a rough surface.

On the other hand, the support substrate 11 on which the support substrate-side adhesion layer 19 is formed is prepared. As illustrated in FIGS. 12D and 13A, the support substrate-side adhesion layer 19 and the first electrode adhesion layer 13a are bonded to each other via thermocompression bonding. At the time, the support substrate-side adhesion layer 19 and a portion of a material constituting the first electrode adhesion layer 13a may be formed into an alloy or components of the material may be diffused.

<Element Isolation Process (Formation of Semiconductor Laminated Structure 12)>

Figure 13B:
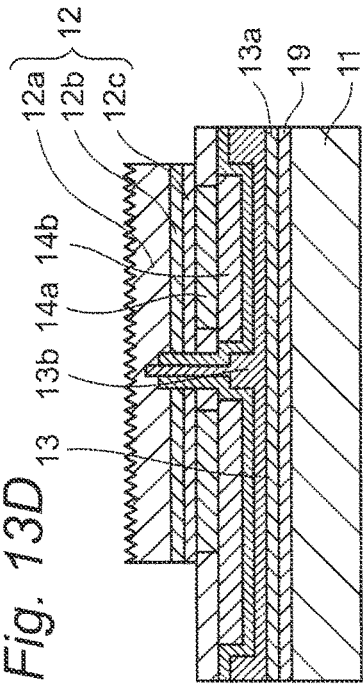
Figure 13C:
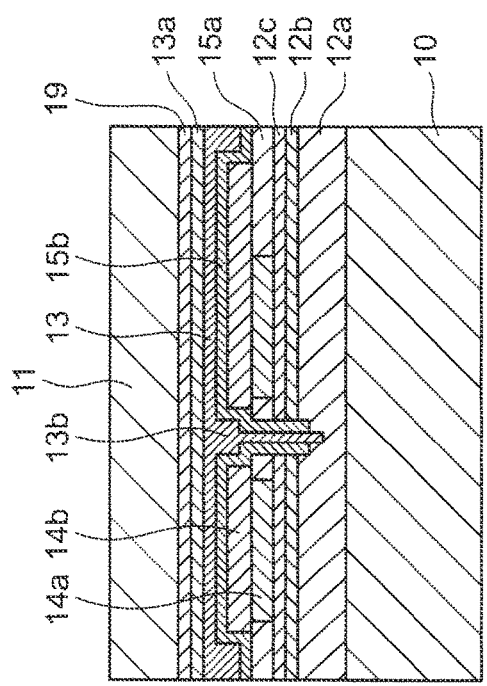
Figure 13D:
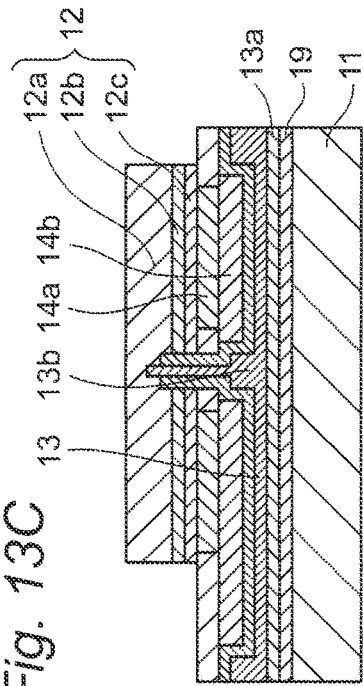

As illustrated in FIG. 13B, the growth substrate 10 on the first semiconductor layer 12a is separated or removed by irradiating solid laser containing an excimer laser and a femtosecond laser from a side of the growth substrate 10 (Laser Lift Off: LLO) or by polishing. After removing the growth substrate 10, thus exposed surface of the first semiconductor layer 12a is subjected to the CMP processing, thereby causing the first semiconductor layer 12a as a desired film to be exposed. Then, as illustrated in FIG. 13C, the upper surface of the first semiconductor layer 12a is provided with a resist and the following etching via RIE, thereby dividing into a plurality of semiconductor laminated structural bodies 12 constituting the respective semiconductor light emitting elements 100. By the etching, the insulating layer 15a is exposed from a portion between the semiconductor laminated structural bodies 12 wherefrom the semiconductor laminated structure is removed. The upper surface of the semiconductor laminated structural body 12 is subjected to anisotropic etching by using the tetramethylammonium hydroxide (TMAH) solution. With the above process, as illustrated in FIG. 13D, the surface of the first semiconductor layer 12a is formed into a rough surface, thereby improving the light extraction efficiency.

<Formation of Pad Electrode 14c>

Figure 14A:
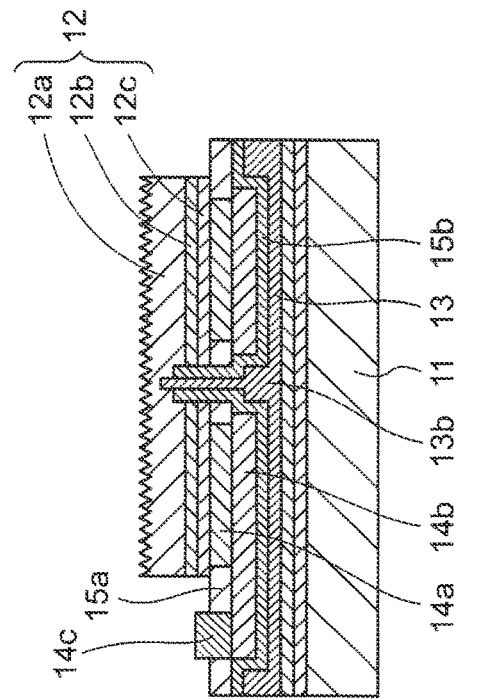
FIG. 14 is a schematic view illustrating a process of a method for manufacturing the semiconductor light emitting element according to the first embodiment, FIG. 14A showing an opening in which the wiring electrode is exposed on a bottom surface of the opening, FIG. 14B showing a pad electrode formed on the wiring electrode in the opening, FIG. 14C showing the protective film for covering the upper surface and the side surfaces of the semiconductor laminated structural body, and FIG. 14D showing a rear face adhesion layer for mounting the semiconductor light emitting element on the mounted substrate.
Figure 14B:
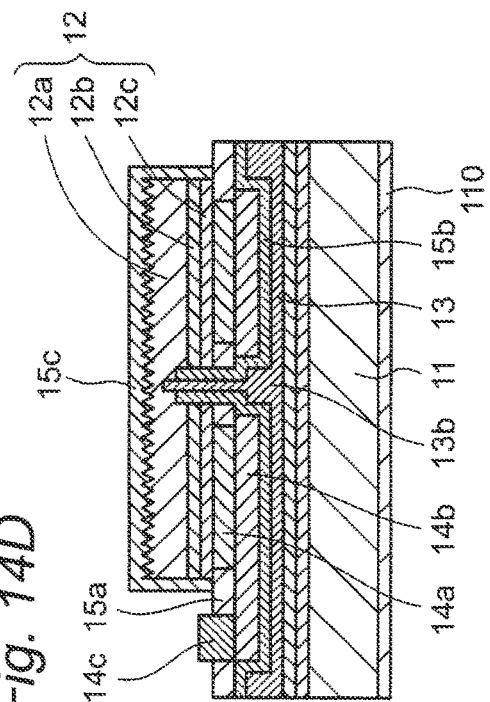

A resist including an opening is provided on the upper surface of the insulating layer 15a exposed in between the semiconductor laminated structural bodies 12 and, through the opening, the insulating layer 15a is removed. Then, as illustrated in FIG. 14A, the wiring electrode 14b is exposed on a bottom surface of the opening. As illustrated in FIG. 14B, the pad electrode 14c is formed on the wiring electrode 14b exposing to the bottom surface of the opening, followed by removing the resist.

<Formation of Protective Film 15c and Rear Face Adhesion Layer 110>

Figure 14C:
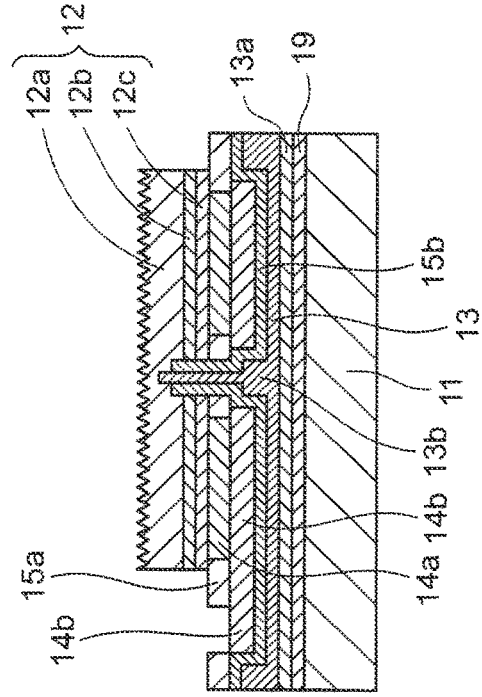
Figure 14D:
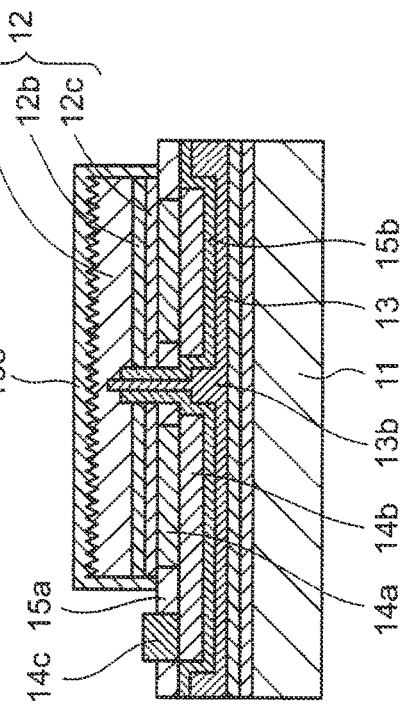

As illustrated in FIG. 14C, the protective film 15c for covering the upper surface and the side surfaces of the semiconductor laminated structural body 12 is formed. Subsequently, as illustrated in FIG. 14D, the rear face adhesion layer 110 for mounting the semiconductor light emitting element 100 on the mounted substrate is formed on all over the rear surface of the support substrate.

<Formation of Light Shielding Member 16, Bump 17, Wavelength Conversion Member 18>

Figure 15A:
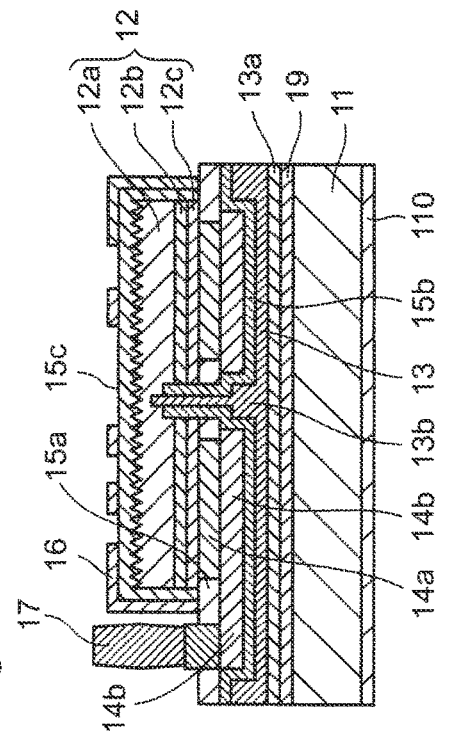
FIG. 15 is a schematic view illustrating a process of a method for manufacturing the semiconductor light emitting element according to the first embodiment, FIG. 15A showing a light shielding member formed on a portion of the upper surface and the side surfaces of the semiconductor laminated structural body, FIG. 15B showing a bump higher than the semiconductor laminated structural body formed on the pad electrode, FIG. 15C showing the exposed surfaces of the pad electrode, the insulating layer, the protective film, the light shielding member, and the bump covered by a wavelength conversion member, and FIG. 15D showing the resin cut such that the upper surface of the bump is exposed and the bump has the same height as the upper surface of the wavelength conversion member.
Figure 15B:
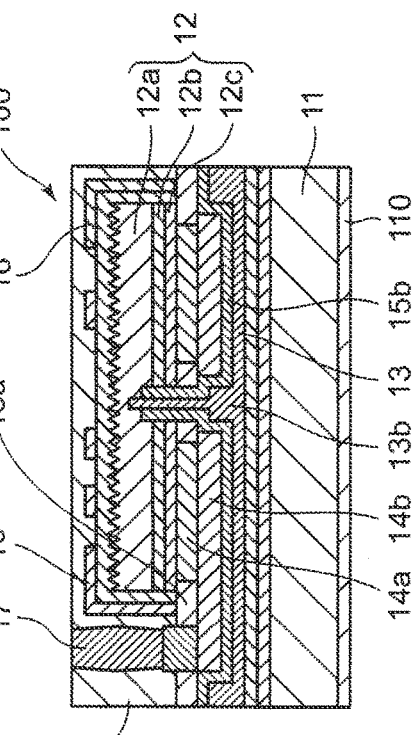
Figure 15C:
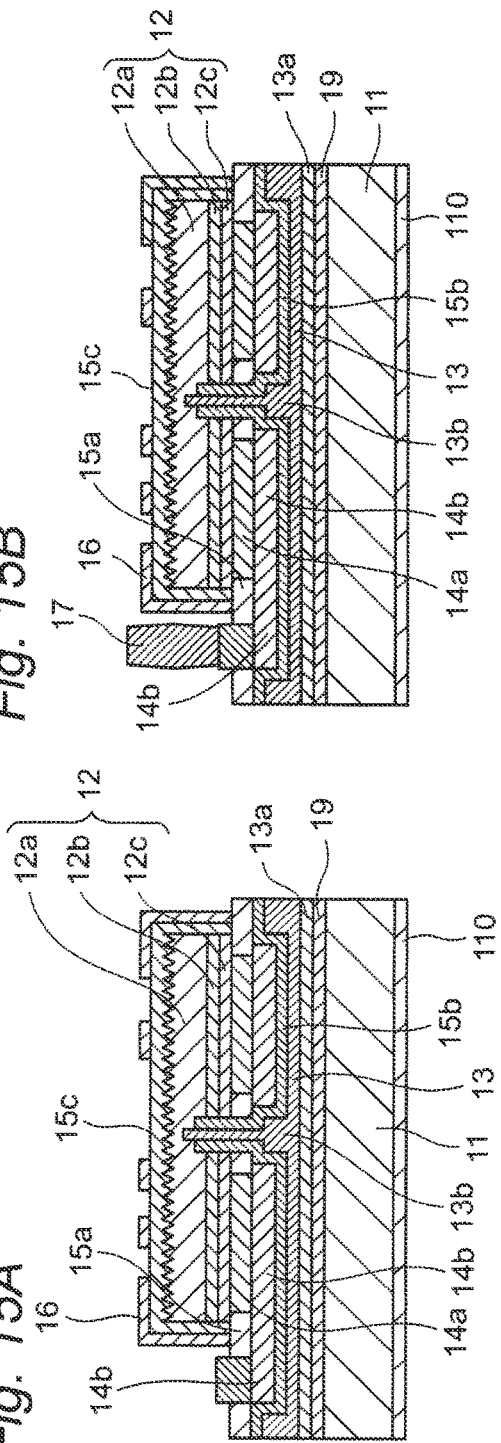
Figure 15D:
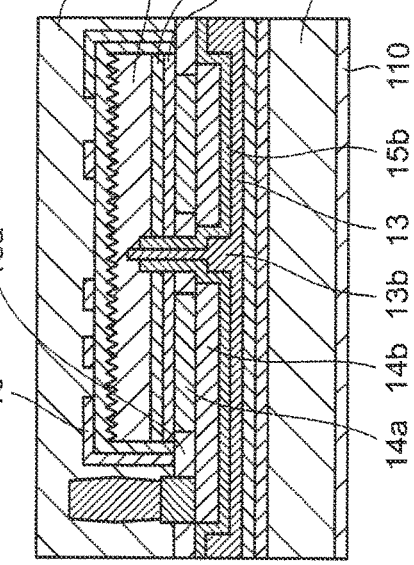

As illustrated in FIG. 15A, the light shielding member 16 containing a metal is formed on a portion of the upper surface (i.e., a predetermined area) and the side surfaces of the semiconductor laminated structural body 12 via the protective film 15c. The light shielding member 16 provided on the portion of the upper surface and the side surfaces are formed of the same material into one piece. The light shielding member 16 positioned above is formed on a predetermined area of the center portion of the semiconductor laminated structural body 12 such that the opening having a shape that the character N is enclosed by a circle is formed. The insulating layer can be provided between the protective film 15c and the light shielding member 16. Accordingly, a possible short circuit between the semiconductor laminated structural body 12 and the light shielding member 16 can be effectively prevented from occurring. As illustrated in FIG. 15B, the bump 17 higher than the semiconductor laminated structural body 12 is formed on the pad electrode 14c As illustrated in FIG. 15C, all the exposed surfaces of the pad electrode 14c, the insulating layer 15a, the protective film 15c, the light shielding member 16, and the bump 17 are covered by the wavelength conversion member 18 made of a resin containing a fluorescent material. The wavelength conversion member 18 is applied to a wafer via, for example, printing, potting, compressive molding, spin-coating, and spray-coating. After the resin of the wavelength conversion member 18 is hardened, as illustrated in FIG. 15D, the resin is cut such that the upper surface of the bump 17 is exposed and the bump 17 comes to have the same height as the upper surface of the wavelength conversion member 18. Thereafter, the wafer is divided into the respective semiconductor light emitting elements 100 by dicing or breaking.

According to the above-mentioned method, the semiconductor light emitting element 100 according to the first embodiment of the present invention is manufactured.

A method for manufacturing a semiconductor light emitting element 200 according to a second embodiment of the present invention is described below with reference to drawings. FIG. 16 is a schematic view illustrating a process of a method for manufacturing the semiconductor light emitting element according to the second embodiment. The method for manufacturing the semiconductor light emitting element 200 of the second embodiment is performed in a similar manner as the first embodiment regarding FIGS. 11 through 14 and is substantially identical to the method for manufacturing the semiconductor light emitting element 100 according to the first embodiment except for a forming method of the light shielding member 26 and the wavelength conversion member 28 differs.

A process different from the method for manufacturing the semiconductor light emitting element 100 of the first embodiment is mainly described below.

<Formation of Light Shielding Member 26, Bump 27, Wavelength Conversion Member 28>

As illustrated in FIG. 16A, the wavelength conversion member 28 having a shape enclosing the character N in circle is provide on the upper surface of the semiconductor laminated structural body 22. The wavelength conversion member 28 can be formed by manufacturing a die (e.g., a mold and a resist) into which resin is flown, followed by hardening thereof. Alternatively, a plate like member preliminary formed into a predetermined shape may be positioned. As illustrated in FIG. 16B, the bump 27 higher than the semiconductor laminated structural body 22 is formed on the pad electrode 24c. As illustrated in FIG. 16C, all the exposed surfaces of the pad electrode 24c, the insulating layer 25a, the bump 27, the wavelength conversion member 28, and the protective film 25c exposed from the wavelength conversion member 28 which covers the upper surface of the semiconductor laminated structural body 22 are covered by the light shielding member 26. The light shielding member 26 is made of a resin containing a reflective material. After the resin of the light shielding member 26 is hardened, as illustrated in FIG. 16D, the resin is cut such that the upper surface of the bump 27 is exposed to have the same height as the upper surface of the light shielding member 26 and the upper surface of the wavelength conversion member 28. Accordingly, the upper surface of the wavelength conversion member 28 is exposed from the light shielding member 26. The light shielding member 26 provided on a portion of the upper surface and the side surfaces of the semiconductor laminated structural body 22 is formed with the same material into one piece.

Then, the wafer is divided into the respective semiconductor light emitting elements 200 by, for example, dicing.

According to the above-mentioned method, the semiconductor light emitting element 200 according to the second embodiment of the present invention is manufactured.

EXAMPLES

Example 1

Example 1 will be described below. In Example 1, the semiconductor light emitting element 100 is manufactured based on a method for manufacturing the semiconductor light emitting element according to the first embodiment.

FIG. 1 is the schematic plane view illustrating the semiconductor light emitting element according to Example 1. FIG. 2 illustrates the semiconductor light emitting element according to Example 1 and is a schematic cross sectional view taken along line I-I' of FIG. 1. FIG. 3 illustrates the semiconductor light emitting element according to Example 1 and is the schematic plane view taken along line II-II' of FIG. 2. The line I-I' of FIG. 1 and FIG. 3 indicates the same line.

The semiconductor light emitting element 100 of Example 1 is formed into a size 2 mm square in planar view and has a substantial rectangular solid external appearance. The semiconductor light emitting element 100 comprises the support substrate 11, the semiconductor laminated structural body 12 including the first semiconductor layer 12a, the luminescent layer 12b, and the second semiconductor layer 12c, the first electrode 13, the second electrode 14 including the reflecting electrode 14a, the wiring electrode 14b, and the pad electrode 14c, the insulating layers 15a and 15b, the protective film 15c, the light shielding member 16, the bump 17, the wavelength conversion member 18, the first electrode adhesion layer 13a, the support substrate-side adhesion layer 19, and the rear face adhesion layer 110.

In the present specification, the laminated structure is described, unless otherwise noted, in the order from the bottom in the cross sectional view from the left. For example, when a laminated layer contains Au, Pt, and Ti in this order from the bottom, the laminated layer is indicated by Au/Pt/Ti.

The semiconductor light emitting element 100 of Example 1 comprises, on the Si substrate 11 having a rectangular shape in planar view, the Si substrate including a rear face adhesion layer 110 made of Au/Pt/Ti (=500 nm/300 nm/2 nm), on the bottom surface of the semiconductor light emitting element, the support substrate-side adhesion layer 19 made of Ti/Pt/Au=2 nm/300 nm/500 nm) and n-side electrode adhesion layer 13a made of Au/Pt/Ti (=500 nm/300 nm/100 nm) are provided on the Si substrate 11 in this order. The support substrate 11 and the semiconductor laminated structural body 12 are connected to each other with Au of the support substrate-side adhesion layer 19 and Au of the n-side electrode adhesion layer 13a to form a bonding member. The n-side electrode adhesion layer 13a is provided to be formed thereon the n-side electrode 13, the insulating layer 15b, and the p-side electrode 14 including the reflecting electrode 14a, the wiring electrode 14b, and the pad electrode 14c. The reflecting electrode 14a is provided to be formed thereon the semiconductor laminated structural body 12 including the p-type semiconductor layer 12c, the luminescent layer 12b, and the n-type semiconductor layer 12a.

The n-side electrode 13 made of an Al alloy is formed almost throughout the n-side electrode adhesion layer 13a. The n-side electrode 13 and the p-side electrode 14 are laminated together at a certain area in planar view. The n-side electrode 13 is connected to the exposed n-type semiconductor layer 12a via the through-hole 13b which pierces through the wiring electrode 14b and the reflecting electrode 14a of the p-side electrode 14, the p-type semiconductor 12c, the luminescent layer 12b, and the portion of the n-type semiconductor layer 12a. The through-hole 13b is formed into a hole of which width becomes narrower from the p-type semiconductor layer 12c to the n-type semiconductor layer 12a.

The insulating layer 15b made of an oxide silicon of 400 nm resides between the n-side electrode 13 and the p-side electrode 14. The insulating film 15b is provided, within the through-hole 13b, so as to be extending from the lower side of the wiring electrode 14b to the first semiconductor layer 12a, resulting in covering portions of the side surfaces (i.e., the wall surface of the through-hole 13b) of the first electrode 13, the wiring electrode 14b, the reflecting electrode 14a, the second semiconductor layer 12c, the luminescent layer 12b, and the first semiconductor layer 12a.

The p-side electrode 14 is provided on the n-side electrode 13 via the insulating layer 15b. The p-side electrode 14 includes the reflecting electrode 14a comprising the Pt/Ti/Ni/Ag (=120 nm/120 nm/120 nm/120 nm), the reflecting electrode 14a being provided so as to cover almost the entire surface of the p-type semiconductor layer 12c. The exposed surface of the p-type semiconductor layer 12c not covered by the reflecting electrode 14a is covered by the insulating layer 15a made of an oxide silicon of the 480 nm.

The wiring electrode 14b comprising Ti/Rh/Ti (=30 nm/340 nm/30 nm) is provided so as to cover the reflecting electrode 14a on a surface opposite to the surface contacting the p-type semiconductor layer 12c of the reflecting electrode 14a. The wiring electrode 14b is extended to the outside the semiconductor laminated structural body 12, i.e., extended to the area where the wiring electrode 14b free from the semiconductor laminated structural body 12 in planar view. Formed on the wiring electrode 14b extended to the outside of the semiconductor laminated structural body 12 is the pad electrode 140 comprising Ti/Pt/Au (=30 nm/300 nm/500 nm). Two pad electrodes 14c are provided in an area different from the semiconductor laminated structural body in planar view on the support substrate 11. Each pad electrode 14c is provided at a position near the edge portion of the element of a center of the two opposing sides of the rectangular semiconductor light emitting element 100.

Further, Au bump 17 for establishing connection with an external power source is formed on each of the two pad electrodes 14c.

The semiconductor laminated structural body 12 is provided on the p-side electrode. The semiconductor laminated structural body 12 comprises the n-type semiconductor layer 12a, the luminescent layer 12b, and the p-type semiconductor layer 12c from the upper surface side (i.e., an opposite side of the Si substrate). As then-type semiconductor layer 12a, an n-type contact layer for establishing a connection with the n-side electrode 13, an Si-doped n-type GaN layer, and further a GaN layer as an undoped nitride semiconductor are laminated. As the luminescent layer 12b, a GaN layer as the barrier layer, a InGaN layer as the well layer, a InGaN layer as the well layer are formed into one set and the set of layers are laminated by 9 sets, and finally the GaN layer as the barrier layer is laminated thereon, resulting in forming a luminescent layer having the multiple quantum-well structure. As the p-type semiconductor layer 12c, a p-type clad layer comprising an Mg-doped AlGaN layer and a p-type contact layer comprising an Mg-doped p-type GaN layer are laminated.

In the semiconductor laminated structural body 12, the upper surface of the n-type semiconductor layer 12a is formed into the rough surface or the surface including irregularity. Further, the p-type semiconductor layer 12c and the luminescent layer 12b are partially removed to form a through-hole 13b and the n-type semiconductor layer 12a is exposed. The plurality of exposed areas of the n-type semiconductor layer 12a having the substantial elliptical shape are arranged in matrix almost equally spaced to each other so as to be positioned throughout the entire surface of the semiconductor laminated structural body 12. The exposed n-type semiconductor layer 12a is connected to the n-side electrode 13 via the through-hole 13b.

The side surfaces and the upper surface of the semiconductor laminated structural body 12 is covered with the protective film 15c made of an oxide silicon of 400 nm.

A portion of the upper surface and the side surfaces of the semiconductor laminated structural body 12 are covered with the light shielding member 16 comprising oxide silicon/Ti/Pt (=1,000 nm/100 nm/100 nm) via the protective film 15c. The oxide silicon as the lowermost layer functions as the insulating layer for electrically separating the semiconductor laminated structural body 12 from the light shielding member 16. The light shielding member 16 covers a portion of the upper surface of the semiconductor laminated structural body 12 so as to form the opening having a shape that the character N is enclosed with a circle in planar view and the protective film 15c is exposed through the opening. The semiconductor laminated structural body 12 is covered with the wavelength conversion member 18 made of a silicone resin containing a YAG based fluorescent material via the light shielding member 16 and the protective film 15c. The wavelength conversion member 18 is provided so as to cover the side surfaces of the bump 17 and the side surfaces of the pad electrode 14c. The upper surface of the wavelength conversion member 18 is almost the same height as the bump 17 and the upper surface of the bump 17 is exposed from the wavelength conversion member 18.

The semiconductor light emitting element 100 of Example 1 is manufactured according to the following manufacturing method.

<Formation of Semiconductor Layer 111>

Initially, the sapphire substrate 10 as the growth substrate having the growing surface with irregularity thereon is placed within the MOCVD device and the GaN layer as the undoped nitride semiconductor is formed as the buffer layer on the growing surface of the sapphire substrate 10. As the n-type contact layer, the Si-doped n-type GaN layer and the GaN layer as the undoped nitride semiconductor are laminated to form the n-type semiconductor layer 12a. On the n-type semiconductor layer 12a, as the luminescent layer 12b, the GaN layer as the barrier layer and the InGaN layer as the well layer formed into a set is laminated by 9 sets and finally the GaN layer as the barrier layer is further laminated thereon, resulting in forming the multiple quantum-well structure. On the luminescent layer 12b, as the p-type semiconductor layer 12c, as the p-type clad layer comprising the Mg-doped AlGaN layer, the p-type contact layer comprising the Mg-doped p-type GaN layer are sequentially laminated. With the above-mentioned process, the wafer formed with the semiconductor laminated structure as the semiconductor laminated structural body 12 is obtained.

Ag/Ni/Ti/Pt are laminated in this order throughout almost the entire surface of the p-type semiconductor layer 12c. The laminated layer of Ag/Ni/Ti/Pt is subjected to a patterning process to obtain a predetermined shape, thereby forming the reflecting electrode 14a. The reflecting electrode 14a includes holes for through-hole 13b.

The insulating film 15a made of an oxide silicon is formed on the p-type semiconductor layer 12c exposed from the reflecting electrode 14a. Accordingly, the surface of the p-type semiconductor layer 12c is covered either one of the reflecting electrode 14a or the insulating layer 15a. The second electrode 14 is conducted with the p-type semiconductor layer 12c via the reflecting electrode 14a selectively provided on the surface of the p-type semiconductor layer 12c.

The wiring electrode 14b provided with Ti/Rh/Ti laminated thereon is formed almost all over the reflecting electrode 14a and the insulating film 15a. The wiring electrode 14b is provided with holes for the through-holes 13b in a similar manner as the reflecting electrode 14a so as to be overlapped with the holes for the through-holes 13b of the reflecting electrode 14a.

Except for the area of the through-holes 13b, a resist is provided on the upper surfaces of the insulating film 15a and the wiring electrode 14b, followed by etching. By the etching, via the opening, the insulating layer 15a, the p-type semiconductor layer 12c, the luminescent layer 12b, and a portion of the n-type semiconductor layer 12a to cause the n-type semiconductor layer 12a to be exposed.

The insulating film 15b for covering the wiring electrode 14b and the insulating layer 15a is formed of the oxide silicon of 400 nm. The insulating film 15b covers all of the wiring electrode 14b, the p-type semiconductor layer 12c, the luminescent layer 12b, and the n-type semiconductor layer 12a exposed as the wall surface of the through-hole 13b. With the configuration, the n-side electrode is insulated from the p-side electrode, the p-type semiconductor layer 12c, and the luminescent layer 12b. Then, the insulating film 15b of the bottom surface of the through-hole 13b is removed by etching to cause the n-type semiconductor layer 12a to be exposed. Further, in order to avoid a possible damage upon etching the insulating layer 15b, a portion of the n-type semiconductor layer 12a (i.e., a portion received the damage) is removed to form the through-hole 13b thereat.

An Al alloy is laminated on the insulating layer 15b so as to conduct to the n-type semiconductor layer 12a, thereby forming the n-side electrode 13. The n-side electrode 13 is conductive to the n-type semiconductor layer 12a exposed to the bottom portion of the through-hole 13b via the Al alloy embedded within the through-hole 13b. Subsequently, the upper surface of the n-side electrode 13 is subjected to the CMP (Chemical Mechanical Polishing) process or the polishing to planarize it. Thus planarlized n-side electrode is provided with the Ti/Pt/Au in this order as the n-side electrode layer 13 laminated thereon in order to alloy with the support substrate-side adhesion layer upon bonding therebetween.

On the other hand, the support substrate 11 with the support substrate-side adhesion layer 19 as a laminated layer of the Ti/Pt/Au on one of the surfaces thereof is prepared and the support substrate-side adhesion layer 19 and the first electrode adhesion layer 13a are bonded together by the thermocompression bonding. The support substrate-side adhesion layer 19 and the first electrode adhesion layer 13a after thermocompression bonded together forms the Au—Au bonding member.

The sapphire substrate 10 on the n-type semiconductor layer 12a is removed from the side of the sapphire substrate 10 by the LLO. After removing the sapphire substrate 10, the surface of the exposed n-type semiconductor layer 12a is subjected to the CMP process to cause the n-type semiconductor layer 12a having a desired film quantity to be exposed. Then, a resist is provided on the upper surface of the n-type semiconductor layer 12a to be subjected to etching by, for example, RIE, followed by division of the semiconductor laminated structural body 12 constituting the semiconductor light emitting element 100. Between thus divided semiconductor laminated structural body 12, the insulating layer 15a formed on the wiring electrode 14b is exposed. The upper surface of the n-type semiconductor layer 12a is subjected to the anisotropic etching by using the TMAH solution to roughen the upper surface.

The upper surface of the insulating layer 15a exposed between the semiconductor laminated structural body 12 in planar view is provided with a resist having opening for exposing the surface of the wiring electrode 14b and after removal of the insulating layer 15a at the resist opening portion, the pad electrode 14c comprising the Ti/Pt/Au is formed in the openings in the resist, followed by removal of the resist.

The protective film 15c for covering the upper surface and the side surfaces of thus divided semiconductor laminated structural body 12 is formed of the oxide silicon of 400 nm. Further, throughout the rear surface of the support substrate is provided with Ti/Pt/Au laminated thereon in this order to form the rear face adhesion layer 110.

The predetermined resist is formed on the protective film 15c and a portion of the upper surface and side surfaces of the semiconductor laminated structural body 12 is provided with oxide silicon/Ti/Pt laminated thereon to form the light shielding member 16. The Au bump 17 higher than the semiconductor laminated structural body 12 is formed on the pad electrode 14c. All the exposed surfaces of the pad electrode 14c, the insulating layer 15a, the protective film 15c, the light shielding member 16, and the Au bump 17 are covered by applying the wavelength conversion member 18 made of the silicone resin containing the YAG base fluorescent material all over the wafer by the compressive molding. After the resin of the wavelength conversion member 18 is hardened, the upper surface of the bump 17 is exposed and the resin is cut such that the upper surface of the bump 17 becomes the same height as the upper surface of the wavelength conversion member 18. The wafer obtained by the above-mentioned method is divided into pieces at a predetermined portion by dicing and breaking, etc., thereby manufacturing the semiconductor light emitting element 100 having 2 mm square size.

According to the present example, since the side surfaces of the luminescent layer is covered by the light shielding member, the semiconductor light emitting element of which color irregularity is improved and light extraction efficiency is optimum can be obtained. Further, since the light shielding member of the upper surface of the semiconductor laminated structural body can be formed into any shape, semiconductor light emitting element can be adjusted to an appropriate light emitting shape.

INDUSTRIAL APPLICABILITY

The semiconductor light emitting element of the present invention can be utilized for the lighting sources, various indicator source, a light source for car, a light source for display, a light source for liquid crystal back light, a light source for sensor, and a traffic light.

REFERENCE SIGNS LIST 10 growth substrate
11, 21 support substrate
12, 22, 42 semiconductor laminated structural body
12a, 22a first semiconductor layer (n-type semiconductor layer)
12b, 22b luminescent layer
12c, 22c second semiconductor layer (p-type semiconductor layer)
13, 23, 33 first electrode (n-side electrode)
13a, 23a first electrode adhesion layer (n-side electrode adhesion layer)
13b, 23b, 33b through-hole
14, 24, 34 second electrode (p-side electrode)
14a, 24a, 34a, 44a reflecting electrode
14b, 24b, 34b, 44b wiring electrode
14c, 24c, 34c, 44c pad electrode
15a, 15b, 25a, 25b, 35a, 35b, 45a, 45b insulating layer
15c, 25c protective film
16, 26 light shielding member
17, 27 bump
18, 28 wavelength conversion member
19, 29 support substrate-side adhesion layer
110, 210 rear face adhesion layer
100, 200, 300, 400 semiconductor light emitting element

What is claimed is:
1. A semiconductor light emitting element comprising:
a support substrate;
a semiconductor laminated structural body provided on the support substrate, the semiconductor laminated structural body having a first semiconductor layer, a luminescent layer below the first semiconductor layer, and a second semiconductor layer below the luminescent layer;
a first electrode electrically connected to the first semiconductor layer;
a second electrode electrically connected to the second semiconductor layer, the second electrode comprising:
a wiring electrode disposed above a portion of an upper surface of the first electrode,
a reflecting electrode disposed on a first portion of an upper surface of the wiring electrode, and
a pad electrode disposed on a second portion of the upper surface of the wiring electrode;

a first insulating layer disposed on a third portion of the upper surface of the wiring electrode at a location between the reflecting electrode and the pad electrode in a lateral direction;

a protective film disposed on the semiconductor laminated structural body, wherein the protective film includes a first portion disposed on an upper, light-extraction surface of the semiconductor laminated structural body, and a second portion disposed on lateral surfaces of the semiconductor laminated structural body;

a light shielding member disposed on the protective film, wherein the light shielding member includes a first portion disposed on a portion of an upper surface of the protective film, and a second portion disposed on lateral surfaces of the protective film, the light shielding member being electrically and physically separated from both of the first electrode and the second electrode by the first insulating layer, and the second portion being on an outer side of the first portion; and a wavelength conversion member covering at least a portion of the upper surface of the semiconductor laminated structural body that is not covered by the light shielding member, wherein the light shielding member has an opening extending through the first portion of the light shielding member, the opening being configured such that light is extractable from the light emitting device via the opening, and wherein an entirety of a lower surface of the second semiconductor layer is exposed from the protective film, and an upper surface of the first insulating layer is in direct contact with the second semiconductor layer, the protective film, and the light shielding member.

2. The semiconductor light emitting element according to claim 1, wherein the first electrode and the second electrode are disposed between the support substrate and the semiconductor laminated structural body.

3. The semiconductor light emitting element according to claim 2, wherein the wiring electrode of the second electrode includes a portion that extends outward from the underside of the semiconductor laminated structural body, and the pad electrode is provided on the portion of the wiring electrode that extends outward.

4. The semiconductor light emitting element according to claim 3, wherein the semiconductor light emitting element has a rectangular shape, and wherein the pad electrode is positioned in an area other than a corner portion of the semiconductor light emitting element.

5. The semiconductor light emitting element according to claim 2, wherein the wavelength conversion member covers at least part of the light shielding member.

6. The semiconductor light emitting element according to claim 2, wherein the side surfaces of the semiconductor laminated structural body are inclined.

7. The semiconductor light emitting element according to claim 2, wherein the first portion of the light shielding member and the second portion of the light shielding member are made of the same material.

8. The semiconductor light emitting element according to claim 2, wherein the first electrode and the second electrode overlap with a second insulating layer disposed therebetween.

9. The semiconductor light emitting element according to claim 8, wherein the wiring electrode of the second electrode includes a portion that extends outward from the underside of the semiconductor laminated structural body, and the pad electrode is provided on the portion of the wiring electrode that extends outward.

10. The semiconductor light emitting element according to claim 9, wherein the semiconductor light emitting element has a rectangular shape, and wherein the pad electrode is positioned in an area other than a corner portion of the semiconductor light emitting element.

11. The semiconductor light emitting element according to claim 2, wherein the light shielding member contains a metal.

12. The semiconductor light emitting element according to claim 11, wherein the light shielding member comprises at least one selected from a group consisting of Ni, Pt, Rh, Ti, Ag and Al.

13. The semiconductor light emitting element according to claim 2, wherein the light shielding member is made of a resin containing a reflective material.

14. The semiconductor light emitting element according to claim 13, wherein the reflective material comprises at least one selected from a group consisting of $ZrO_2$, $Al_2O_3$, $TiO_2$ and $SiO_2$.

15. The semiconductor light emitting element according to claim 1, wherein the wavelength conversion member covers at least part of the light shielding member.

16. The semiconductor light emitting element according to claim 1, wherein the side surfaces of the semiconductor laminated structural body are inclined.

17. The semiconductor light emitting element according to claim 1, wherein the first portion of the light shielding member and the second portion of the light shielding member are made of the same material.

18. The semiconductor light emitting element according to claim 1, wherein the first electrode and the second electrode overlap with a second insulating layer disposed therebetween.

19. The semiconductor light emitting element according to claim 1, wherein the light shielding member contains a metal.

20. The semiconductor light emitting element according to claim 19, wherein the light shielding member comprises at least one selected from a group consisting of Ni, Pt, Rh, Ti, Ag and Al.

21. The semiconductor light emitting element according to claim 1, wherein the light shielding member is made of a resin containing a reflective material.

22. The semiconductor light emitting element according to claim 21, wherein the reflective material comprises at least one selected from a group consisting of $ZrO_2$, $Al_2O_3$, $TiO_2$ and $SiO_2$.

23. The semiconductor light emitting element according to claim 1, wherein the upper surface of the semiconductor laminated structural body has a rough surface or is formed with an irregularity thereon.

24. The semiconductor light emitting element according to claim 23, wherein the rough surface or the irregularity is formed at least in the portion of the upper surface that is not covered with the light shielding member.

25. The semiconductor light emitting element according to claim 1, wherein the first portion of the protective film is disposed on an entirety of the upper surface of the semiconductor laminated structural body, and part of the first portion of the protective film is exposed via the opening of the light shielding member.

26. The semiconductor light emitting element according to claim 1, wherein an outermost lateral surface of the wavelength conversion member constitutes an outermost lateral surface of the semiconductor light emitting element.

* * * * *